(12) United States Patent
Fayneh et al.

(10) Patent No.: US 12,123,908 B1
(45) Date of Patent: Oct. 22, 2024

(54) LOOPBACK TESTING OF INTEGRATED CIRCUITS

(71) Applicant: PROTEANTECS LTD., Haifa (IL)

(72) Inventors: Eyal Fayneh, Givatayim (IL); Guy Redler, Haifa (IL); Shai Cohen, Haifa (IL); Evelyn Landman, Haifa (IL)

(73) Assignee: PROTEANTECS LTD., Haifa (IL)

( * ) Notice: Subject to any disclaimer, the term of this patent is extended or adjusted under 35 U.S.C. 154(b) by 0 days.

(21) Appl. No.: 18/367,333

(22) Filed: Sep. 12, 2023

(51) Int. Cl.
*G01R 31/28* (2006.01)
*G01R 31/317* (2006.01)
*G01R 31/3177* (2006.01)

(52) U.S. Cl.
CPC ... *G01R 31/2896* (2013.01); *G01R 31/31727* (2013.01); *G01R 31/3177* (2013.01)

(58) Field of Classification Search
CPC .......... G01R 31/2896; G01R 31/31727; G01R 31/3177
See application file for complete search history.

(56) References Cited

U.S. PATENT DOCUMENTS

| | | | |
|---|---|---|---|
| 4,555,663 | A | 11/1985 | Shimizu |
| 5,548,539 | A | 8/1996 | Vlach et al. |
| 5,748,509 | A | 5/1998 | Fewster |
| 5,774,403 | A | 6/1998 | Clark, II et al. |
| 5,818,251 | A | 10/1998 | Intrater |
| 5,895,629 | A | 4/1999 | Russell et al. |
| 5,956,497 | A | 9/1999 | Ratzel et al. |
| 5,966,527 | A | 10/1999 | Krivokapic et al. |
| 6,172,546 | B1 | 1/2001 | Liu et al. |
| 6,182,253 | B1 | 1/2001 | Lawrence et al. |
| 6,486,716 | B1 | 11/2002 | Minami et al. |
| 6,586,921 | B1 | 7/2003 | Sunter |

(Continued)

FOREIGN PATENT DOCUMENTS

| | | |
|---|---|---|
| CN | 1886668 A | 12/2006 |
| CN | 101014991 A | 8/2007 |

(Continued)

OTHER PUBLICATIONS

Kan Takeuchi et al; "FEOL/BEOL wear-out estimator using stress-to-frequency conversion of voltage/temperature-sensitive ring oscillators for 28nm automotive MCUs"; IEEE, pp. 265-268, Oct. 20, 2016. 268, doi: 10.1109/ESSCIRC.2016.7598293.

(Continued)

*Primary Examiner* — Farhana A Hoque
*Assistant Examiner* — Joseph O Nyamogo
(74) *Attorney, Agent, or Firm* — The Roy Gross Law Firm, LLC; Roy Gross

(57) ABSTRACT

Loopback testing may be provided for one or more transmission output paths of a semiconductor Integrated Circuit (IC). One or more parametric loopback sensors are provided in the semiconductor IC, each parametric loopback sensor being configured to receive a clocked data input signal to a respective transmitter of the IC and a signal from a transmission output path from the respective transmitter of the IC, and to generate a respective sensor output based on a comparison of the clocked data input signal and the signal from the transmission output path for the respective transmitter of the IC. A programmable load circuit is also provided in the semiconductor IC, coupled to each transmission output path.

20 Claims, 6 Drawing Sheets

(56) References Cited

U.S. PATENT DOCUMENTS

| | | | |
|---|---|---|---|
| 6,683,484 | B1 | 1/2004 | Kueng et al. |
| 6,807,503 | B2 | 10/2004 | Ye et al. |
| 6,873,926 | B1 * | 3/2005 | Diab .................. G01R 29/02 |
| | | | 702/117 |
| 6,882,172 | B1 | 4/2005 | Suzuki et al. |
| 6,948,388 | B1 | 9/2005 | Clayton et al. |
| 7,038,483 | B1 | 5/2006 | Suzuki et al. |
| 7,067,335 | B2 | 6/2006 | Weiner et al. |
| 7,254,507 | B2 | 8/2007 | Dosho et al. |
| 7,288,958 | B2 | 10/2007 | Takagi |
| 7,369,893 | B2 | 5/2008 | Gunderson |
| 7,443,189 | B2 | 10/2008 | Ramappa |
| 7,455,450 | B2 | 11/2008 | Liu et al. |
| 7,501,832 | B2 | 3/2009 | Spuhler et al. |
| 7,649,373 | B2 | 1/2010 | Tokunaga |
| 7,701,246 | B1 | 4/2010 | Plants et al. |
| 7,818,601 | B2 * | 10/2010 | LaBerge ............. G11C 7/1006 |
| | | | 713/401 |
| 7,877,657 | B1 | 1/2011 | Miller et al. |
| 7,940,862 | B2 | 5/2011 | Tanaka et al. |
| 8,001,512 | B1 | 8/2011 | White |
| 8,086,978 | B2 | 12/2011 | Zhang et al. |
| 8,170,067 | B2 | 5/2012 | Zerbe et al. |
| 8,279,976 | B2 | 10/2012 | Lin et al. |
| 8,310,265 | B2 | 11/2012 | Zjajo et al. |
| 8,365,115 | B2 | 1/2013 | Liu et al. |
| 8,418,103 | B2 | 4/2013 | Wang et al. |
| 8,479,130 | B1 | 7/2013 | Zhang et al. |
| 8,633,722 | B1 | 1/2014 | Lai |
| 8,825,158 | B2 | 9/2014 | Swerdlow |
| 8,996,937 | B2 | 3/2015 | Jain et al. |
| 9,275,706 | B2 | 3/2016 | Tam |
| 9,424,952 | B1 | 8/2016 | Seok et al. |
| 9,490,787 | B1 | 11/2016 | Kho et al. |
| 9,536,038 | B1 | 1/2017 | Quinton et al. |
| 9,564,883 | B1 | 2/2017 | Quinton et al. |
| 9,564,884 | B1 | 2/2017 | Quinton et al. |
| 9,632,126 | B2 | 4/2017 | Yoon et al. |
| 9,714,966 | B2 | 7/2017 | Chen et al. |
| 9,760,672 | B1 | 9/2017 | Taneja et al. |
| 9,791,834 | B1 | 10/2017 | Nassar et al. |
| 9,954,455 | B2 | 4/2018 | Lin et al. |
| 9,977,078 | B2 * | 5/2018 | Loke ................ G01R 31/31716 |
| 9,991,879 | B2 | 6/2018 | Huang |
| 10,490,547 | B1 | 11/2019 | Ali et al. |
| 10,509,104 | B1 | 12/2019 | Dato |
| 10,530,347 | B2 | 1/2020 | Tang et al. |
| 11,036,266 | B2 | 6/2021 | Srivastava et al. |
| 11,081,193 | B1 | 8/2021 | Tang |
| 11,409,323 | B2 | 8/2022 | Herberholz et al. |
| 12,013,800 | B1 | 6/2024 | Fayneh et al. |
| 2004/0009616 | A1 | 1/2004 | Huisman et al. |
| 2004/0015793 | A1 | 1/2004 | Saxena et al. |
| 2004/0230385 | A1 | 11/2004 | Bechhoefer et al. |
| 2004/0230396 | A1 | 11/2004 | Ye et al. |
| 2005/0053162 | A1 | 3/2005 | Goishi |
| 2005/0104175 | A1 * | 5/2005 | Itano ................... G11C 7/1066 |
| | | | 257/678 |
| 2005/0114056 | A1 | 5/2005 | Patel et al. |
| 2005/0134350 | A1 | 6/2005 | Huang et al. |
| 2005/0134394 | A1 | 6/2005 | Liu |
| 2005/0154552 | A1 | 7/2005 | Stroud et al. |
| 2005/0285646 | A1 | 12/2005 | Rashid |
| 2006/0049886 | A1 | 3/2006 | Agostinelli, Jr. et al. |
| 2006/0224374 | A1 | 10/2006 | Kwon et al. |
| 2007/0110199 | A1 | 5/2007 | Momtaz et al. |
| 2007/0182456 | A1 | 8/2007 | Agarwal et al. |
| 2007/0288183 | A1 | 12/2007 | Bulkes et al. |
| 2008/0071489 | A1 | 3/2008 | Wissel |
| 2008/0074521 | A1 | 3/2008 | Olsen |
| 2008/0144243 | A1 | 6/2008 | Mariani et al. |
| 2008/0147355 | A1 | 6/2008 | Fields et al. |
| 2008/0183409 | A1 | 7/2008 | Roberts et al. |
| 2008/0186001 | A1 | 8/2008 | Singh et al. |
| 2008/0186044 | A1 | 8/2008 | Singh |
| 2008/0216033 | A1 | 9/2008 | Bucossi et al. |
| 2008/0231310 | A1 | 9/2008 | Vijayaraghavan |
| 2008/0262769 | A1 | 10/2008 | Kadosh et al. |
| 2009/0027077 | A1 | 1/2009 | Vijayaraghavan et al. |
| 2009/0076753 | A1 | 3/2009 | Vijayaraghavan et al. |
| 2009/0096495 | A1 | 4/2009 | Keigo |
| 2009/0183043 | A1 | 7/2009 | Niwa |
| 2009/0222775 | A1 | 9/2009 | Idgunji et al. |
| 2009/0230947 | A1 | 9/2009 | Sumita |
| 2009/0244998 | A1 | 10/2009 | Kim |
| 2009/0273550 | A1 | 11/2009 | Vieri et al. |
| 2009/0278576 | A1 | 11/2009 | Chakravarty |
| 2009/0306953 | A1 | 12/2009 | Liu et al. |
| 2010/0153896 | A1 | 6/2010 | Sewall et al. |
| 2010/0251046 | A1 | 9/2010 | Mizuno et al. |
| 2010/0253382 | A1 | 10/2010 | Wang et al. |
| 2011/0093830 | A1 | 4/2011 | Chen et al. |
| 2011/0102091 | A1 | 5/2011 | Yeric |
| 2011/0109377 | A1 | 5/2011 | Fujibe et al. |
| 2011/0113298 | A1 | 5/2011 | Van Den Eijnden |
| 2011/0169537 | A1 | 7/2011 | Ma |
| 2011/0175658 | A1 | 7/2011 | Nomura |
| 2011/0187433 | A1 | 8/2011 | Baumann et al. |
| 2011/0267096 | A1 | 11/2011 | Chlipala et al. |
| 2011/0295403 | A1 | 12/2011 | Higuchi et al. |
| 2011/0315986 | A1 | 12/2011 | Kaneda et al. |
| 2012/0025846 | A1 | 2/2012 | Minas et al. |
| 2012/0038388 | A1 | 2/2012 | Tseng et al. |
| 2012/0051395 | A1 | 3/2012 | Chen et al. |
| 2012/0063524 | A1 | 3/2012 | Stott |
| 2012/0074973 | A1 | 3/2012 | Baldwin et al. |
| 2012/0163074 | A1 | 6/2012 | Franca-Neto et al. |
| 2012/0170616 | A1 | 7/2012 | Tsai et al. |
| 2012/0187991 | A1 | 7/2012 | Sathe et al. |
| 2012/0212246 | A1 | 8/2012 | Benjamin et al. |
| 2012/0217976 | A1 | 8/2012 | Clarkson |
| 2012/0221906 | A1 | 8/2012 | Shetty et al. |
| 2012/0242490 | A1 | 9/2012 | Ramaswami |
| 2013/0088256 | A1 | 4/2013 | Chlipala et al. |
| 2013/0226491 | A1 | 8/2013 | Miguelanez, II et al. |
| 2013/0241690 | A1 | 9/2013 | Wallace et al. |
| 2013/0293270 | A1 | 11/2013 | Lee et al. |
| 2013/0335875 | A1 | 12/2013 | Baumann |
| 2014/0132293 | A1 | 5/2014 | Abadir et al. |
| 2014/0132315 | A1 | 5/2014 | Sharma et al. |
| 2014/0143586 | A1 | 5/2014 | Dalumi et al. |
| 2014/0184243 | A1 | 7/2014 | Iyer et al. |
| 2014/0254734 | A1 | 9/2014 | Abdelmoneum et al. |
| 2015/0061707 | A1 | 3/2015 | Balasubramanian et al. |
| 2015/0077136 | A1 | 3/2015 | Li |
| 2015/0121158 | A1 | 4/2015 | Wang et al. |
| 2015/0199223 | A1 | 7/2015 | Banerjee et al. |
| 2015/0332451 | A1 | 11/2015 | Amzaleg et al. |
| 2015/0355033 | A1 | 12/2015 | Zhang et al. |
| 2015/0365049 | A1 | 12/2015 | Ozawa et al. |
| 2016/0033574 | A1 | 2/2016 | Serrer et al. |
| 2016/0042784 | A1 | 2/2016 | Rim et al. |
| 2016/0072511 | A1 | 3/2016 | Maekawa |
| 2016/0087643 | A1 | 3/2016 | Nozaki |
| 2016/0125434 | A1 | 5/2016 | Kohn et al. |
| 2016/0131708 | A1 | 5/2016 | Huang et al. |
| 2016/0153840 | A1 | 6/2016 | Huang et al. |
| 2016/0156176 | A1 | 6/2016 | Kunz, Jr. et al. |
| 2016/0164503 | A1 | 6/2016 | Kim et al. |
| 2016/0203036 | A1 | 7/2016 | Mezic et al. |
| 2016/0254804 | A1 | 9/2016 | Meng |
| 2017/0038265 | A1 | 2/2017 | Abdelmoneum et al. |
| 2017/0093399 | A1 | 3/2017 | Atkinson et al. |
| 2017/0160339 | A1 | 6/2017 | Jenkins |
| 2017/0179173 | A1 | 6/2017 | Mandai et al. |
| 2017/0199089 | A1 | 7/2017 | Fritchman et al. |
| 2017/0199228 | A1 | 7/2017 | Hsieh et al. |
| 2017/0214516 | A1 | 7/2017 | Rivaud et al. |
| 2017/0329391 | A1 | 11/2017 | Jaffari et al. |
| 2017/0344102 | A1 | 11/2017 | Kolla et al. |
| 2017/0345490 | A1 | 11/2017 | Yoshimoto et al. |
| 2017/0364818 | A1 | 12/2017 | Wu et al. |
| 2018/0034549 | A1 | 2/2018 | Kikuchi |
| 2018/0109245 | A1 | 4/2018 | Takagi |

(56) References Cited

U.S. PATENT DOCUMENTS

| | | | |
|---|---|---|---|
| 2018/0183413 | A1 | 6/2018 | Wong et al. |
| 2018/0365974 | A1 | 12/2018 | Haas et al. |
| 2019/0019096 | A1 | 1/2019 | Yoshida et al. |
| 2019/0117122 | A1 | 4/2019 | Kurachi et al. |
| 2019/0305074 | A1 | 10/2019 | Kande et al. |
| 2020/0028514 | A1 | 1/2020 | Hanke et al. |
| 2020/0203333 | A1 | 6/2020 | Chen et al. |
| 2020/0209070 | A1 | 7/2020 | Tang et al. |
| 2020/0210354 | A1* | 7/2020 | Fayneh .............. G01R 31/2853 |
| 2020/0313664 | A1 | 10/2020 | Azam et al. |
| 2022/0260630 | A1 | 8/2022 | Fayneh et al. |
| 2022/0349935 | A1 | 11/2022 | Fayneh et al. |
| 2023/0098071 | A1 | 3/2023 | Chonnad et al. |

FOREIGN PATENT DOCUMENTS

| | | |
|---|---|---|
| CN | 101241429 A | 8/2008 |
| CN | 101344898 A | 1/2009 |
| CN | 102422169 A | 4/2012 |
| CN | 101915625 B | 7/2012 |
| CN | 102273077 B | 9/2014 |
| CN | 105210188 A | 12/2015 |
| CN | 106959400 A | 7/2017 |
| CN | 108534866 A | 9/2018 |
| CN | 113466670 A | 10/2021 |
| DE | 102007002253 A1 | 7/2007 |
| DE | 102012219971 A1 | 5/2013 |
| DE | 102014216786 B3 | 10/2015 |
| EP | 962991 A1 | 12/1999 |
| EP | 1262755 A1 | 12/2002 |
| EP | 2006784 A1 | 12/2008 |
| EP | 2060924 A1 | 5/2009 |
| EP | 2413150 A1 | 2/2012 |
| EP | 2770313 A1 | 8/2014 |
| JP | S57116228 A | 7/1982 |
| JP | 2000215693 A | 8/2000 |
| JP | 2002243800 A | 8/2002 |
| JP | 2008147245 A | 6/2008 |
| JP | 2009021348 A | 1/2009 |
| JP | 2009065533 A | 3/2009 |
| JP | 2012037238 A | 2/2012 |
| JP | 2016111563 A | 6/2016 |
| KR | 101232207 B1 | 2/2013 |
| KR | 2013110989 A | 10/2013 |
| KR | 20150073199 A | 6/2015 |
| TW | 200914841 A | 4/2009 |
| TW | 201614256 A | 4/2016 |
| TW | 201709669 A | 3/2017 |
| WO | 2005080099 A1 | 9/2005 |
| WO | 2013070218 A1 | 5/2013 |
| WO | 2013027739 A1 | 3/2015 |
| WO | 2019097516 A1 | 5/2019 |
| WO | 2019102467 A1 | 5/2019 |
| WO | 2019135247 A1 | 7/2019 |
| WO | 2019202595 A1 | 10/2019 |
| WO | 2019244154 A1 | 12/2019 |
| WO | 2020141516 A1 | 7/2020 |
| WO | 2020230130 A1 | 11/2020 |
| WO | 2021019539 A1 | 2/2021 |
| WO | 2021111444 A1 | 6/2021 |
| WO | 2021214562 A1 | 10/2021 |
| WO | 2022/009199 A1 | 1/2022 |
| WO | 2022215076 A1 | 10/2022 |
| WO | 2023238128 A1 | 12/2023 |
| WO | 2024/166103 A1 | 8/2024 |

OTHER PUBLICATIONS

Kan Takeuchi et al; "Wear-out stress monitor utilising temperature and voltage sensitive ring oscillators" IET Circuits, Devices & Systems. vol. 12 No. 2, pp. 182-188, Jan. 15, 2018. doi: 10.1049/iet-cds.2017.0153.

Kan Takeuchi et al; "Experimental Implementation of 8.9Kgate Stress Monitor in 28nm MCU along with Safety Software Library for IoT Device Maintenance"; IEEE International Reliability Physics Symposium (IRPS). Mar. 31, 2019. doi: 10.1109/IRPS.2019.8720583.

Dan Ernst et al; "Razor: circuit-level correction of timing errors for low-power operation," in IEEE Micro, vol. 24, No. 6, pp. 10-20, Nov.-Dec. 2004, doi: 10.1109/MM.2004.85.

Dan Ernst et al; "Razor: A Low-Power Pipeline Based on Circuit-Level Timing Speculation"; Proceedings. 36th Annual International Symposium on Microarchitecture (MICRO-36). Dec. 1, 2003. San Diego, CA, USA, 2003, pp. 7-18, doi: 10.1109/MICRO.2003.1253179.

James P. Hofmeister, et al, "Ball Grid Array (BGA) Solder Joint Intermittency Detection: SJ BIST™", IEEE Aerospace Conference Proceedings, Apr. 2008, paper #1148, Version 1. doi: 10.1109/AERO.2008.4526624.

Paulheim H, Meusel R. "A decomposition of the outlier detection problem into a set of supervised learning problems", Machine Learning, Sep. 2015, vol. 100 Issue 2, pp. 509-531. DOI 10.1007/s10994-015-5507-y.

Zhang L, Marron JS, Shen H, Zhu Z., "Singular value decomposition and its visualization", Journal of Computational and Graphical Statistics, Dec. 2007, vol. 6 Issue 4, pp. 833-854. DOI: 10.1198/106186007X256080.

Shinkai, Ken-ichi et al. "Device-parameter estimation with on-chip variation sensors considering random variability."; In 16th Asia and South Pacific Design Automation Conference (ASP-DAC 2011), pp. 683-688. IEEE, Jan. 25, 2011. doi: 10.1109/ASPDAC.2011.5722274.

Weiwei Shan et al. "An improved timing error prediction monitor for wide adaptive frequency scaling"; IEICE Electronics Express, vol. 14, No. 21, pp. 1-6, Oct. 20, 2017. DOI: 10.1587/elex.14.20170808.

Agilent Technologies; "Clock Jitter Analysis with femto-second resolution"; Jan. 1, 2008.

Yousuke Miyake et al; "Temperature and voltage estimation using ring-oscillator-based monitor for field test"; IEEE 23rd Asian Test Symposium; pp. 156-161, Nov. 16, 2014. doi: 10.1109/ATS.2014.38.

Basab Datta at al; "Analysis of a Ring Oscillator Based on Chip Thermal Sensor in 65nm Technology"; Online at: https://web.archive.org/web/20140328234617/http://www-unix.ecs.umass.edu/~dkumar/ab4_658_report/lab4_report.htm; Sep. 5, 2018.

Tilman Wolf et al; "Collaborative Monitors for Embedded System Security". Jan. 1, 2006. First Workshop on Embedded System Security in conjunction with EMSOFT '06, Oct. 26, 2006, Seoul, South Korea.

Sandeep Kumar Samal et al; "Machine Learning Based Variation Modeling and Optimization for 3D ICs"; J. Inf. Commun. Converg. Eng. 14(4): 258-267, Dec. 2016. DOI: 10.6109/jicce.2016.14.4.258.

Yin-Nien Chen et al; "Impacts of Work Function Variation and Line-Edge Roughness on TFET and FinFET Devices and 32-Bit CLA Circuits"; J. Low Power Electron. Appl. 2015, 5, 101-115. May 21, 2015. doi: 10.3390/jlpea5020101.

Yong Zhao et al; "A Genetic Algorithm Based Remaining Lifetime Prediction for a VLIW Processor Employing Path Delay and IDDX Testing"; IEEE; Apr. 12, 2016. 2016 11th International Conference on Design and Technology of Integrated Systems in Nanoscale Era (DTIS), Istanbul, Turkey, 2016, pp. 1-4, doi: 10.1109/DTIS.2016.7483805.

Vivek S Nandakumar et al, "Statistical static timing analysis flow for transistor level macros in a microprocessor"; 2010, 11th International Symposium on Quality Electronic Design (ISQED), pp. 163-170, Mar. 22, 2010. doi: 10.1109/ISQED.2010.5450412.

Jing Li et al, "Variation Estimation and Compensation Technique in Scaled LTPS TFT Circuits for Low-Power Low-Cost Applications"; IEEE Transactions on Computer-Aided Design of Integrated Circuits and Systems, vol. 28(1): 46-59, Jan. 1, 2009. doi: 10.1109/TCAD.2008.2009149.

Xie Qing et al "Variation-Aware Joint Optimization of the Supply Voltage and Sleep Transistor Size for 7nm FinFET Technology"; 2014 IEEE 32nd international conference on computer design, pp. 380-385, Oct. 19, 2014. doi: 10.1109/ICCD.2014.6974709.

(56) References Cited

OTHER PUBLICATIONS

Rebaud B et al, "Timing slack monitoring under process and environmental variations: Application to a DSP performance optimization"; Microelectronics Journal vol. 42 Issue 5, pp. 718-732, Feb. 8, 2011. doi: 10.1016/j.mejo.2011.02.005.

Dierickx B et al, "Propagating variability from technology to system Level"; 2007 International Workshop on Physics of Semiconductor Devices, Mumbai, India, 2007, pp. 74-79, doi: 10.1109/IWPSD.2007.4472457.

Zheng K., "A Comparison of Digital Droop Detection Techniques in ASAP7 FinFET"; Research Review. Sep. 2019.

Hongge Chen, "Novel Machine Learning Approaches for Modeling Variations in Semiconductor Manufacturing," Master thesis, Jun. 2017.

Nidhal Selmane, Shivam Bhasin, Sylvain Guilley, Tarik Graba, Jean-Luc Danger. "WDDL is Protected Against Setup Time Violation Attacks." CHES, Sep. 2009, Lausanne, Switzerland. pp. 73-83. doi: 10.1109/FDTC.2009.40.

Nidhal Selmane, Shivam Bhasin, Sylvain Guilley, Jean-Luc Danger. "Security evaluation of application-specific integrated circuits and field programmable gate arrays against setup time violation attacks." IET Inf. Secur., 2011, vol. 5, Iss. 4, pp. 181-190. doi: 10.1049/iet-ifs.2010.0238.

Jianfeng Zhang et al, "Parameter Variation Sensing and Estimation in Nanoscale Fabrics"; Journal of Parallel and Distributed Computing; vol. 74, Issue 6, pp. 2504-2511, Jun. 1, 2014. https://doi.org/10.1016/j.jpdc.2013.08.005.

I. A. K. M. Mahfuzul et al, "Variation-sensitive monitor circuits for estimation of Die-to-Die process variation"; 2011 IEEE ICMTS International Conference on Microelectronic Test Structures; pp. 153-157, Apr. 4-7, 2011. doi: 10.1109/ICMTS.2011.5976878.

Ying Qiao et al, "Variability-aware compact modeling and statistical circuit validation on SRAM test array"; Proceedings vol. 9781, Design-Process-Technology Co-optimization for Manufacturability X, Mar. 16, 2016. https://doi.org/10.1117/12.2219428.

David Herres, "The Eye Diagram: What is it and why is it used?"; Online at: https://www.testandmeasurementtips.com/basics-eye-diagrams/, Aug. 16, 2016.

Yu-Chuan Lin et al, "A 10-GB/s Eye-Opening Monitor Circuit for Receiver Equalizer Adaptations in 65-nm CMOS;" in IEEE Transactions on Very Large Scale Integration (VLSI) Systems, vol. 28, No. 1, pp. 23-34, Jan. 2020. doi: 10.1109/TVLSI.2019.2935305.

Mridul Agarwal et al, "Circuit Failure Prediction and Its Application to Transistor Aging"; 5th IEEE VLSI Test Symposium (VTS'07), pp. 277-286, May 6-10, 2007. doi: 10.1109/VTS.2007.22.

Keith A. Bowman et al, "Energy-Efficient and Metastability-Immune Resilient Circuits for Dynamic Variation Tolerance"; IEEE Journal of Solid-State Circuits vol. 44, Issue 1, pp. 49-63, Jan. 2009. doi: 10.1109/JSSC.2008.2007148.

Shidhartha Das et al, "A Self-Tuning DVS Processor Using Delay-Error Detection and Correction"; IEEE Journal of Solid-State Circuits; vol. 41, Issue 4, pp. 792-804, Apr. 2006. doi: 10.1109/JSSC.2006.870912.

Shidhartha Das et al, "RazorII: In Situ Error Detection and Correction for PVT and SER Tolerance" 2008 IEEE International Solid-State Circuits Conference—Digest of Technical Papers, Feb. 3-7, 2008. doi: 10.1109/JSSC.2008.2007145.

Ramyanshu Datta et al, "On-Chip Delay Measurement for Silicon Debug"; GLSVLSI '04: Proceedings of the 14th ACM Great Lakes symposium on VLSI; pp. 145-148, Apr. 26-28, 2004. https://doi.org/10.1145/988952.988988.

Alan Drake et al, "A Distributed Critical-Path Timing Monitor for a 65nm High-Performance Microprocessor"; 2007 IEEE International Solid-State Circuits Conference. Digest of Technical Papers; Feb. 11-15, 2007. doi: 10.1109/ISSCC.2007.373462.

Matthias Eireiner et al, "In-Situ Delay Characterization and Local Supply Voltage Adjustment for Compensation of Local Parametric Variations"; IEEE Journal of Solid-State Circuits; vol. 42, Issue 7, pp. 1583-1592, Jul. 2007. doi: 10.1109/JSSC.2007.896695.

Matthew Fojtik et al, "Bubble Razor: An architecture-independent approach to timing-error detection and correction"; 2012 IEEE International Solid-State Circuits Conference; Feb. 19-23, 2012. doi: 10.1109/ISSCC.2012.6177103.

Matthew Fojtik et al, "Bubble Razor: Eliminating Timing Margins in an ARM Cortex-M3 Processor in 45 nm CMOS Using Architecturally Independent Error Detection and Correction"; IEEE Journal of Solid-State Circuits; vol. 48, Issue 1, pp. 66-81, Jan. 2013. doi: 10.1109/JSSC.2012.2220912.

Piero Franco et al, "On-Line Delay Testing of Digital Circuits"; Proceedings of IEEE VLSI Test Symposium; Apr. 25-28, 1994. doi: 10.1109/VTEST.1994.292318.

V. Huard et al, "Adaptive Wearout Management with in-situ aging monitors"; 2014 IEEE International Reliability Physics Symposium; Jun. 1-5, 2014. pp. 6B.4.1-6B.4.11, doi: 10.1109/IRPS.2014.6861106.

Liangzhen Lai et al, "SlackProbe: A Flexible and Efficient In Situ Timing Slack Monitoring Methodology"; IEEE Transactions on Computer-Aided Design of Integrated Circuits and Systems; vol. 33, Issue 8, pp. 1168-1179, Aug. 2014. doi: 10.1109/TCAD.2014.2323195.

M. Saliva et al, "Digital Circuits Reliability with In-Situ Monitors in 28nm Fully Depleted SOI"; 2015 Design, Automation Mar. 9-13, 2015. doi: 10.7873/DATE.2015.0238.

Martin Wirnshofer et al, "A Variation-Aware Adaptive Voltage Scaling Technique based on In-Situ Delay Monitoring"; 14th IEEE International Symposium on Design and Diagnostics of Electronic Circuits and Systems; pp. 261-266, Apr. 13-15, 2011. doi: 10.1109/DDECS.2011.5783090.

Martin Wirnshofer et al, "An Energy-Efficient Supply Voltage Scheme using In-Situ Pre-Error Detection for on-the-fly Voltage Adaptation to PVT Variations"; 2011 International Symposium on Integrated Circuits; pp. 94-97, Dec. 12-14, 2011. doi: 10.1109/ISICir.2011.6131888.

Martin Wirnshofer et al, "On-line supply voltage scaling based on in situ delay monitoring to adapt for PVTA variations"; Journal of Circuits, Systems and Computers; vol. 21, No. 08, Mar. 7, 2012. doi: 10.1142/S0218126612400270.

S. Mhira et al, "Dynamic Adaptive Voltage Scaling in Automotive environment"; 2017 IEEE International Reliability Physics Symposium (IRPS); pp. 3A-4.1-3A-4.7, Apr. 2-6, 2017. doi: 10.1109/IRPS.2017.7936279.

A. Benhassain et al., "Early failure prediction by using in-situ monitors: Implementation and application results"; Online at: https://ceur-ws.org/Vol-1566/Paper6.pdf, Mar. 18, 2016.

Charles R. Lefurgy et al, "Active Management of Timing Guardband to Save Energy in Power7"; 2011 44th Annual IEEE/ACM International Symposium on Microarchitecture (Micro); pp. 1-11; Dec. 3-7, 2011.

C. R. Lefurgy et al, "Active Guardband Management in Power7+ to Save Energy and Maintain Reliability"; in IEEE Micro, vol. 33, No. 4, pp. 35-45, Jul.-Aug. 2013. doi: 10.1109/MM.2013.52.

B. Zandian et al, "Cross-layer resilience using wearout aware design flow"; 2011 IEEE/IFIP 41st International Conference on Dependable Systems & Networks (DSN), pp. 279-290, Jun. 27-30, 2011. doi: 10.1109/DSN.2011.5958226.

M. Cho et al., "Postsilicon Voltage Guard-Band Reduction in a 22 nm Graphics Execution Core Using Adaptive Voltage Scaling and Dynamic Power Gating"; in IEEE Journal of Solid-State Circuits, vol. 52, No. 1, pp. 50-63, Jan. 4, 2017. doi: 10.1109/JSSC.2016.2601319.

W. Shan et al, "Timing error prediction based adaptive voltage scaling for dynamic variation tolerance"; 2014 IEEE Asia Pacific Conference on Circuits and Systems (APCCAS), pp. 739-742, Nov. 17-20, 2014. doi: 10.1109/APCCAS.2014.7032887.

J. Li et al, "Robust and in-situ self-testing technique for monitoring device aging effects in pipeline circuits"; 2014 51st ACM/EDAC/IEEE Design Automation Conference (DAC), pp. 1-6, Jun. 1-5, 2014.

X. Shang et al, "A 0.44V-1.1V 9-transistor transition-detector and half-path error detection technique for low power applications"; 2017 IEEE Asian Solid-State Circuits Conference (A-SSCC), pp. 205-208, Nov. 6-8, 2017. doi: 10.1109/ASSCC.2017.8240252.

(56) References Cited

OTHER PUBLICATIONS

Liangzhen Lai et al, "Accurate and inexpensive performance monitoring for variability-aware systems"; 2014 19th Asia and South Pacific Design Automation Conference (ASP-DAC), pp. 467-473, Jan. 20-23, 2014. doi: 10.1109/ASPDAC.2014.6742935.

Martin Wirnshofer et al., "Adaptive voltage scaling by in-situ delay monitoring for an image processing circuit"; 2012 IEEE 15th International Symposium on Design and Diagnostics of Electronic Circuits & Systems (DDECS), pp. 205-208, Apr. 18-20, 2012. doi: 10.1109/DDECS.2012.6219058.

Youhua Shi et al, "Suspicious timing error prediction with in-cycle clock gating"; International Symposium on Quality Electronic Design (ISQED), pp. 335-340, Mar. 4-6, 2013. doi: 10.1109/ISQED.2013.6523631.

Youhua Shi et al, "In-situ timing monitoring methods for variation-resilient designs"; 2014 IEEE Asia Pacific Conference on Circuits and Systems (APCCAS), pp. 735-738, Nov. 17-20, 2014. doi: 10.1109/APCCAS.2014.7032886.

Jongho Kim et al., "Adaptive delay monitoring for wide voltage-range operation"; 2016 Design, Automation & Test in Europe Conference & Exhibition (Date), pp. 511-516, Mar. 14-18, 2016. Europe Conference & Exhibition (Date), pp. 511-516, Mar. 14-18, 2016.

Xiaobin Yuan et al., "Design Considerations for Reconfigurable Delay Circuit to Emulate System Critical Paths"; in IEEE Transactions on Very Large Scale Integration (VLSI) Systems, vol. 23, No. 11, pp. 2714-2718, Nov. 2015. doi: 10.1109/TVLSI.2014.2364785.

\* cited by examiner

LOOPBACK TESTING OF INTEGRATED CIRCUITS

FIELD OF THE INVENTION

The invention relates to the field of integrated circuits.

BACKGROUND

Semiconductor integrated circuits (ICs) typically include analog and digital electronic circuits on a flat semiconductor substrate, such as a silicon wafer. Microscopic transistors are printed onto the substrate using photolithography techniques to produce complex circuits of billions of transistors in a very small area, making modern electronic circuit design using ICs both low cost and high performance. ICs are produced in assembly lines of factories, termed foundries, which have commoditized the production of ICs, such as complementary metal-oxide-semiconductor (CMOS) ICs.

Typically, ICs are produced in large batches on a single wafer of electronic-grade silicon (EGS) or other semiconductor (such as GaAs). The wafer is cut (diced) into many pieces, each containing one copy of the circuit. Each of these pieces is called a 'die.'

Digital ICs are typically packaged in a metal, plastic, glass, or ceramic casing. The casing, or 'package,' is connected to a circuit board, such as by using solder. Types of packages include a lead frame (though-hole, surface mount, chip-carrier, and/or the like), pin grid array, chip scale package, ball grid array, and/or the like, to connect between the IC pads and the circuit board.

Input/Output (I/O) connections or ports (pins) from a die or IC, for example to another die or another component (which may be another IC), can degrade over time. One approach for performance monitoring of I/O ports is loopback testing. An internal loopback test can be used to test logic. This uses on-die loopback test circuitry. However, it is also useful to perform a loopback test by connecting the output from a transmission I/O pin to a receiver on the same IC (and/or die). This may allow confirmation that the transmitter is functioning correctly. Typically, an external testing circuit is required for this purpose.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

In one aspect, there is provided a loopback testing system for one or more transmission output paths of a semiconductor Integrated Circuit (IC). The system comprises: one or more parametric loopback sensors in the semiconductor IC, each parametric loopback sensor being configured to receive a clocked data input signal to a respective transmitter of the IC and a signal from a transmission output path from the respective transmitter of the IC and to generate a respective sensor output based on a comparison of the clocked data input signal and the signal from the transmission output path for the respective transmitter of the IC; and a programmable load circuit in the semiconductor IC, coupled to each transmission output path.

In embodiments, the one or more transmission output paths are a plurality of transmission output paths and the one or more parametric loopback sensors are a plurality of parametric loopback sensors. In embodiments, the programmable load circuit comprises: a programmable load; and a multiplexer, coupled to each transmission output path of the plurality of transmission output paths and configured to selectively couple one of the received transmission output paths to the programmable load.

In embodiments, the programmable load is an RC load.

In embodiments, the programmable load circuit comprises: a programmable load, configured to receive the signal from a transmission output path and provide a loaded signal output; a pin characterization sensor, configured to receive the loaded signal output and generate a characterization signal based on the loaded signal output; and a finite state machine, configured to set the programmable load based on the characterization signal.

In embodiments, the pin characterization sensor comprises a slew rate characterization sensor.

In embodiments, each of the one or more parametric loopback sensors is a respective first parametric loopback sensor. Then, the loopback testing system further comprises: one or more receivers, each receiver being configured to receive a signal from the programmable load circuit coupled to a respective one of the one or more transmission output paths and to generate a respective receiver output; and one or more second parametric loopback sensors, each second parametric loopback sensor being configured to receive a respective receiver output from a receiver of the one or more receivers and a signal from a transmission output path from the respective transmitter of the IC and to generate a respective second sensor output based on a comparison of the receiver output and the signal from the transmission output path for the respective transmitter of the IC.

In embodiments, a structure of the one or more second parametric loopback sensors is the same as structure of the one or more first parametric loopback sensors.

In embodiments, the programmable load circuit comprises a programmable load, configured to receive the signal from a transmission output path and provide a loaded signal output and wherein each receiver is configured to receive the loaded signal output as the signal from the programmable load circuit.

In embodiments, the one or more receivers comprise a common receiver for all of the one or more transmission output paths and the one or more second parametric loopback sensors comprise a common second parametric loopback sensor for all of the one or more transmission output paths.

In embodiments, each transmitter of the IC has an associated input state element receiving a respective clock signal and wherein each of the one or more parametric loopback sensors is further configured to receive the respective clock signal.

In embodiments, each parametric loopback sensor is configured to selectively operate: in a clock-scan mode, in which the parametric loopback sensor is repeatedly operated to generate the respective sensor output using a different delay applied to the received clock signal; and in a fixed-clock mode, in which the parametric loopback sensor is repeatedly operated to generate the respective sensor output using the same delay applied to the received clock signal.

In embodiments, each parametric loopback sensor comprises: a first state-element, configured to receive a signal derived from the clocked data input signal at a first state-element data input, to receive a signal derived from the clock signal at a first state-element clock input and to provide a clocked data signal as a first state-element output; a programmable delay line, configured to receive the clock signal and output a delayed clock signal; a second state-element, configured to receive the signal from the transmission output path at a second state-element data input, to receive the delayed clock signal at a second state-element clock input and to provide a clocked transmission output path signal as a second state-element output; and a comparison circuit, configured to generate a comparison circuit output based on a comparison of the clocked data signal and the clocked transmission output path signal.

In embodiments, the comparison circuit comprises a comparison (logic) gate or comparison element. A suitable example is an XOR gate.

In embodiments, each parametric loopback sensor further comprises: a third state-element, having a third state-element data input and configured to receive a signal derived from the clock signal at a clock input and to provide a sensor fail signal as an output; and an OR gate, configured to receive the comparison circuit output at a first input and the sensor fail signal at a second input, to generate an output based on the first and second inputs, the output of the OR gate being provided to the third state-element data input.

In embodiments, each parametric loopback sensor further comprises: a fourth state-element, configured to receive a low logic level at a fourth state-element data input and a signal derived from the clock signal at a fourth state-element clock input and to provide a fourth state-element element output based on the received low logic level and a fourth state-element clock input, the fourth state-element further configured to receive a reset signal at a fourth state-element set state input; and a fifth state-element, configured to receive a signal based on the fourth state-element output at a fifth state-element data input and a signal derived from the clock signal at a fifth state-element clock input and to provide a fifth state-element output based on the signal received at the fifth state-element data input and the fifth state-element clock input, the fifth state-element further configured to receive the reset signal at a fifth state-element set state input. The third state-element is beneficially further configured to receive the fifth state-element output at a third state-element reset state input.

In another aspect, there may be considered an input/output (I/O) block for a semiconductor Integrated Circuit (IC). The I/O block comprises: a plurality of transmitters, each transmitter being configured to receive a respective clocked data input signal and output a transmission signal on a respective transmission output path; a plurality of parametric loopback sensors, each parametric loopback sensor being configured to receive the clocked data input signal and transmission signal for a respective transmitter, and to generate a respective sensor output based on a comparison of the clocked data input signal and the transmission signal for the respective transmitter; and a programmable load circuit, coupled to each transmission output path.

In embodiments, the I/O block may comprise any of the features disclosed herein in respect of the loopback testing system or any other aspect disclosed herein. In other words, this aspect may be combined with any other aspect disclosed herein. Some examples include the following optional embodiments.

In embodiments, the programmable load circuit comprises: a programmable load; and a multiplexer, configured to receive the respective transmission signal from each transmission output path and selectively couple one of the received transmission signals to the programmable load.

In embodiments, the programmable load circuit comprises: a programmable load, configured to receive the transmission signal from a transmission output path and provide a loaded signal output; a pin characterization sensor, configured to receive the loaded signal output and generate a characterization signal based on the loaded signal output; and a finite state machine, configured to set the programmable load based on the characterization signal.

In embodiments, each transmitter has a respective contact pad in the transmission output path or wherein each transmitter corresponds with a respective pin of the semiconductor IC.

In a further aspect, there is provided a semiconductor Integrated Circuit (IC), comprising: a plurality of pins, each pin defining a respective transmission output path, a signal carried on each transmission output path being based on a respective IC internal clocked data signal; a plurality of parametric loopback sensors, each parametric loopback sensor being configured to receive the IC internal clocked data signal and the signal carried on the transmission output for a respective pin, and to generate a respective sensor output based on a comparison of the IC internal clocked data signal and the signal carried on the transmission output for the respective pin; and a programmable load circuit, coupled to each transmission output path.

In embodiments, the IC may comprise any of the features disclosed herein in respect of the loopback testing system, I/O block or any other aspect disclosed herein. In other words, this aspect may be combined with any other aspect disclosed herein.

In a yet further aspect, there is provided a non-transitory computer readable medium having stored thereon a computer-readable encoding of a loopback testing system. The computer-readable encoding of the loopback testing system comprises any of the features disclosed herein in respect of the loopback testing system. For example, the loopback testing system may comprise: one or more parametric loopback sensors, each parametric loopback sensor being configured to receive a clocked data input signal to a respective transmitter of the IC and a signal from a transmission output path from the respective transmitter of the IC and to generate a respective sensor output based on a comparison of the clocked data input signal and the signal from the transmission output path for the respective transmitter of the IC; and a programmable load circuit, coupled to each transmission output path. In embodiments, the encoding of a loopback testing system may be provided as a computer program (for example, in the form of instructions for manufacturing or fabricating a loopback testing system) or as some other form of computer readable medium. In embodiments, the encoding of a loopback testing system (however embodied) may comprise any of the features disclosed herein in respect of the loopback testing system, I/O block, IC or any other aspect disclosed herein. In other words, this aspect may be combined with any other aspect disclosed herein.

In addition to the exemplary aspects and embodiments described above, further aspects and embodiments will become apparent by reference to the figures and by study of the following detailed description. The skilled person will appreciate that combinations and sub-combinations of specific features disclosed herein may also be provided, even if not explicitly described.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

Disclosed herein are circuits, devices, systems, and methods for loopback testing of one or more transmission output paths of a semiconductor Integrated Circuit (IC). A loopback testing system uses one or more parametric loopback sensors, that is, a loopback sensor configured for determining transmission parameters, with an optional additional logic test that determines if the logic circuitry of the IC is operating correctly. The one or more parametric loopback sensors are in the semiconductor IC (that is, on the die, integrally formed with it). Each parametric loopback sensor is for testing a specific transmitter or a specific transmission path or pin (having at least one transmitter). Each transmitter receives a data signal, from which an output signal is generated. This data signal is provided as an input to the parametric loopback sensor. The signal at the output of the transmitter or on the transmission path or pin is also provided as an input to the parametric loopback sensor. By comparing the data signal and the signal at the output of the transmitter or on the transmission path or pin, a performance measurement for the transmitter can be determined.

Advantageously, a programmable load circuit in the semiconductor IC (on the die) is coupled to each transmission path or pin (in other words, to the output of each transmitter). The effect of the programmable load circuit may be to emulate the load provided by a receiver coupled to the transmission path or pin (for instance on another die or IC), which may be in the same package or in another package. A common programmable load circuit for multiple transmission sensors may be efficient in terms of space (since a load may require more semiconductor surface area than a sensor) and power.

Such configurations on-die may permit high-speed loop-back functionality per transmission path or pin. In particular, such testing may be possible in a test-mode, before die-to-die assembly. The use of an on-die loopback tester may replace separate loopback testing device and/or loopback evaluation board or EVB. Parallel operation during built-in self-test (BIST) may also be possible.

The parametric loopback sensor allows a wide range of possible measurements. For example, parametric transmission loop-delay characterization per pin may be determined. Measurements may be made considering load conditions, for instance lane-load or electrostatic discharge (ESD). Transmission skew can be determined.

Based on the measurements made, mitigation may be employed. For example, dies may be mixed and matched before assembly in a common package for uniform package performance. Outlier transmission pins may be identified.

Figure 1:
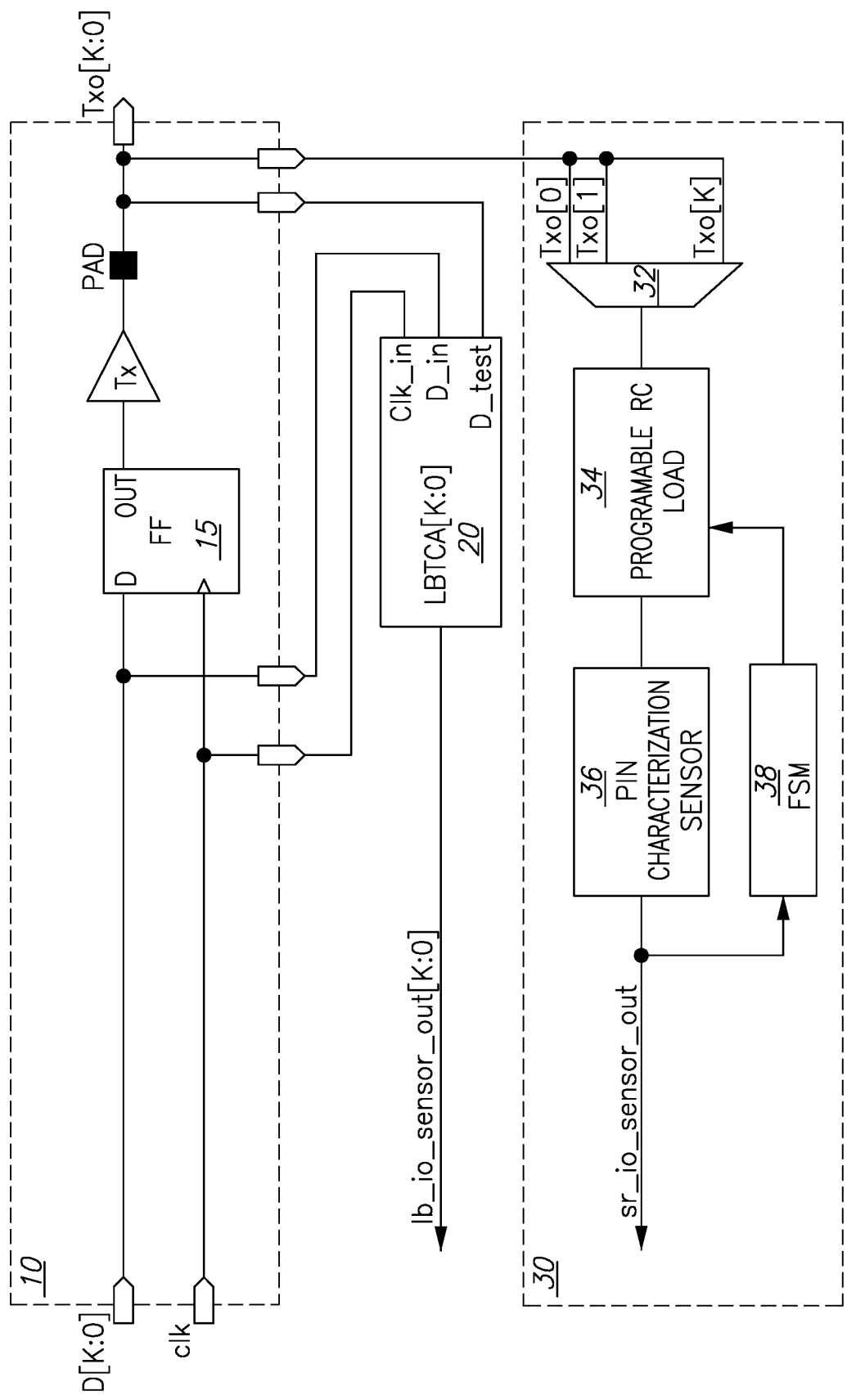
FIG. 1 shows a schematic circuit diagram of an example transmission path and loopback testing system according to the disclosure.

Referring first to FIG. 1, there is shown a schematic circuit diagram of an example transmission path and loopback testing system according to the disclosure. This loopback testing system is suitable for measuring K pins (or transmission paths). It may form part of an I/O block of the semiconductor IC. A transmission path (I/O circuit) 10 comprises a flip-flop (sampling element, state element or register) 15, receiving a data signal D[K:0] at a data signal input D and a clock signal clk at a clock signal input. In other words, the data signal D[K:0], which is effectively the input to the transmission path 10, is a synchronous (clocked) data signal and is associated with the clock signal clk. The output out of the flip-flop 15 is provided to a transmitter (or transmission buffer) Tx. The output of the transmitter (which is the signal on the transmission output path from the transmitter) is provided as a transmission signal Txo to drive the transmission pin, via the contact pad (PAD). The loopback testing system comprises: a parametric loopback sensor 20; and a load circuit 30. The parametric loopback sensor or Tile Connectivity Agent (TCA) 20 (LBTCA[K:0]) receives the data signal input D at a data input port D_in, the clock signal clk at a clock input port Clk_in and the transmission signal Txo at a test signal input port D_test. The LBTCA 20 provides a sensor output lb_io_sensor_out[K:0], based on a comparison of the data signal input D at the data input port D_in and the transmission signal Txo at the test signal input port D_test.

Each transmission path 10 has a respective, separate parametric loopback sensor 20. However, the load circuit 30, which is advantageously programmable, is common to all K transmission paths. The load circuit 30 comprises: a multiplexer 32; a programmable RC load (RC filter) 34; a pin characterization sensor 36 (for example, a slew rate sensor or TCA); and finite state machine (FSM) 38. The programmable RC load 34 represents a realistic pin load (for instance, comprising lane-load, ESD or other components). The output from the programmable RC load 34 is a loaded signal output and is provided to the pin characterization sensor 36.

This system thus provides a mechanism for performing an I/O loop-back and measuring the transmission loop-delay of multiple (K) pins of an I/O system.

The transmission loop delay is measured by comparing the data signal input D and the transmission signal Txo. In particular, it may be measured based on the time from the rising edge of the clock until the signal change of the transmission signal Txo (corresponding with the signal change of the data signal input D). The output of the parametric loopback sensor 20 may detect or identify connectivity and/or transmission weakness issues.

The pin characterization sensor 36 generates a characterization signal (for example, a digital signal) based on the loaded signal output. Here, the pin characterization sensor 36 is typically a slew-rate TCA (SRTCA) and thereby measures the loaded pin slew-rate. Although the pin characterization sensor 36 is shown with a single input (which represents a data input), an example SRTCA would typically have additional inputs for measurement and control (for instance, a clock input and other threshold inputs), but these are not shown in FIG. 1 for simplicity. The measured slew-rate (an example of a characterization signal) represents the expected slew-rate at the receiver. This measured slew-rate (or other characterization signal) may then used as feedback, via the FSM 38, to the configure the programmable RC load 34 and thereby tune the RC load 34 to represent realistic load conditions. The FSM 38 thus acts as a feedback circuit and could more generally be implemented as such. The FSM 38 may thus comprise analog circuitry, digital circuitry, a suitably programmed processor or a combination of these features (or equivalently implemented as an alternative type of controller). A programmable RC load is typical, but other types of programmable load may be possible in practice.

The FSM 38 thus generates a control signal for the programmable RC load 34 based on the digital output of the pin characterization sensor 36. This control signal for the programmable RC load 34 may adjust the resistance and/or capacitance of the programmable RC load 34. In embodiments, the control signal for the programmable RC load 34 may enable or disable a requisite number of capacitors in the programmable RC load 34 in accordance with the control signal. For example, where the pin characterization sensor 36 is a SRTCA, the digital output of the pin characterization sensor represents a slew rate. As an example, the higher the slew rate (as indicated by the digital output of the SRTCA), the higher the capacitance instructed by the control signal generated by the FSM 38. Conversely, as the slew rate reduces (again, as indicated by the digital output of the SRTCA), the FSM 38 may generate a control signal that reduces the capacitance of the programmable RC load 34. The relationship between the slew rate and the capacitance may be linear (proportional) or non-linear.

The loopback testing system can operate in two modes: (1) Clock scan mode (transmission Loop-Delay measurement); and (2) Fixed-clock mode (logic loopback).

When the system operates in Clock Scan mode, the clock is shifted by a delay-line circuit during the data transfer. Each measurement is taken with a different clock shift. The clock shift is unsynchronized to the data (this is standard TCA operation at a hold measurement mode). In this case, the output of the LBTCA would be equal to logic [1] if a fail event occurs, that is the signal at the data input port D_in is different from the signal at the data test port D_test. When a pass event occurs (that is the signal at the data input port D_in is the same as the signal at the data test port D_test), the output of the LBTCA becomes equal to logic [0]. This is discussed in more detail with reference to FIG. 3 below. The clock shift at which the fail event changes to a pass event represents the transmission loop-delay.

When the system operates in Fixed-clock mode, the data comparison is performed at a certain fixed clock shift (constant delay-line). Again, the output of the LBTCA would be equal to logic [1] if a fail event occurs, that is the signal at the data input port Din is different from the signal at the data test port D_test. In this way, the LBTCA can provide a conventional logic loopback test.

In general terms, there may be considered a loopback testing system for one or more transmission output paths of a semiconductor Integrated Circuit (IC). The system comprises one or more parametric loopback sensors in the semiconductor IC. Each parametric loopback sensor is configured to receive: a clocked data input signal to a respective transmitter of the IC; and a signal from a transmission output path from the respective transmitter of the IC. Each parametric loopback sensor is further configured to generate a respective sensor output based on a comparison of the clocked data input signal and the signal from the transmission output path for the respective transmitter of the IC. Advantageously, the loopback testing system further comprises a programmable load circuit in the semiconductor IC, coupled to each transmission output path. This allows on-die parametric loopback testing in an efficient way. A common programmable load circuit can be used for multiple on-die parametric loopback tests.

Similarly, there may be considered an input/output (I/O) block for a semiconductor Integrated Circuit (IC), the I/O block comprising: a plurality of transmitters, each transmitter being configured to receive a respective clocked data input signal and output a transmission signal on a respective transmission output path; and a plurality of parametric loopback sensors, each parametric loopback sensor being configured to receive the clocked data input signal and transmission signal for a respective transmitter, and to generate a respective sensor output based on a comparison of the clocked data input signal and the transmission signal for the respective transmitter. Advantageously, the I/O block may further comprise a programmable load circuit, coupled to each transmission output path. It may also be understood that each transmitter has a respective contact pad in the transmission output path and/or each transmitter corresponds with a respective pin of the semiconductor IC. Effectively, the I/O block may comprise the loopback testing system. Features disclosed in respect of the loopback testing system may equally be disclosed in respect of the I/O block.

There may be further considered a semiconductor Integrated Circuit (IC), comprising: a plurality of pins, each pin defining a respective transmission output path, a signal carried on each transmission output path being based on a respective IC internal clocked data signal; and a plurality of parametric loopback sensors, each parametric loopback sensor being configured to receive the IC internal clocked data signal and the signal carried on the transmission output for a respective pin, and to generate a respective sensor output based on a comparison of the IC internal clocked data signal and the signal carried on the transmission output for the respective pin. Advantageously, the IC may further comprise a programmable load circuit, coupled to each transmission output path. Effectively, the IC may comprise the I/O block and/or loopback testing system. Features disclosed in respect of the I/O block and/or loopback testing system may equally be disclosed in respect of the IC.

There may additionally be considered a non-transitory computer readable medium having stored thereon a computer-readable encoding of a loopback testing system, the computer-readable encoding of the loopback testing system comprising encodings of: one or more parametric loopback sensors, each parametric loopback sensor being configured to receive a clocked data input signal to a respective transmitter of the IC and a signal from a transmission output path from the respective transmitter of the IC and to generate a respective sensor output based on a comparison of the clocked data input signal and the signal from the transmission output path for the respective transmitter of the IC. Advantageously, the loopback testing system further comprises a programmable load circuit, coupled to each transmission output path. Features disclosed in respect of the loopback testing system may equally be disclosed in respect of this encoding. In addition, the encoding may further include an encoding of an I/O block and/or IC as disclosed herein.

Features common to all these possible implementations will now be discussed. Although there may be one transmission output path and one parametric loopback sensor, in embodiments, the one or more transmission output paths are a plurality of transmission output paths and the one or more parametric loopback sensors are a plurality of parametric loopback sensors. In embodiments, the programmable load circuit comprises: a programmable load; and a multiplexer, coupled to (or configured to receive a signal from) each transmission output path of the plurality of transmission output paths and configured to selectively couple one of the received transmission output paths to the programmable load. Beneficially, the programmable load is an RC load. Additionally or alternatively, the programmable load circuit may comprise: a programmable load, configured to receive the signal from a transmission output path and provide a loaded signal output; a pin characterization sensor, configured to receive the loaded signal output and generate a characterization signal based on the loaded signal output; and a finite state machine (feedback circuit), configured to set the programmable load based on the characterization signal. For example, the pin characterization sensor may comprise (or be) a slew rate characterization sensor. The finite state machine may then be configured to change a capacitance of the programmable (RC) load in accordance with a slew rate indication provided by the slew rate characterization sensor. For instance, the finite state machine may be configured increase the capacitance of the programmable (RC) load in response to an increase in the slew rate indication and/or decrease the capacitance of the programmable (RC) load in response to a decrease in the slew rate indication.

In embodiments, each transmitter of the IC has an associated input state element receiving a respective clock signal. Then, each of the one or more parametric loopback sensors is further configured to receive the respective clock signal.

Advantageously, each parametric loopback sensor may be configured to selectively operate: in a clock-scan mode, in which the parametric loopback sensor is repeatedly operated to generate the respective sensor output using a different delay applied to the received clock signal (for instance, each delay being applied according to a repeating sequence); and in a fixed-clock mode, in which the parametric loopback sensor is repeatedly operated to generate the respective sensor output using the same delay (which may be effectively zero or can correspond with the intrinsic delay of the programmable delay line) applied to the received clock signal. The clock-scan mode may allow a test of the transmission path. The fixed-clock mode may allow a logic loopback test.

Specific details of implementations will again be discussed below. Further references to the general sense of the disclosure will again be made subsequently.

Figure 2:
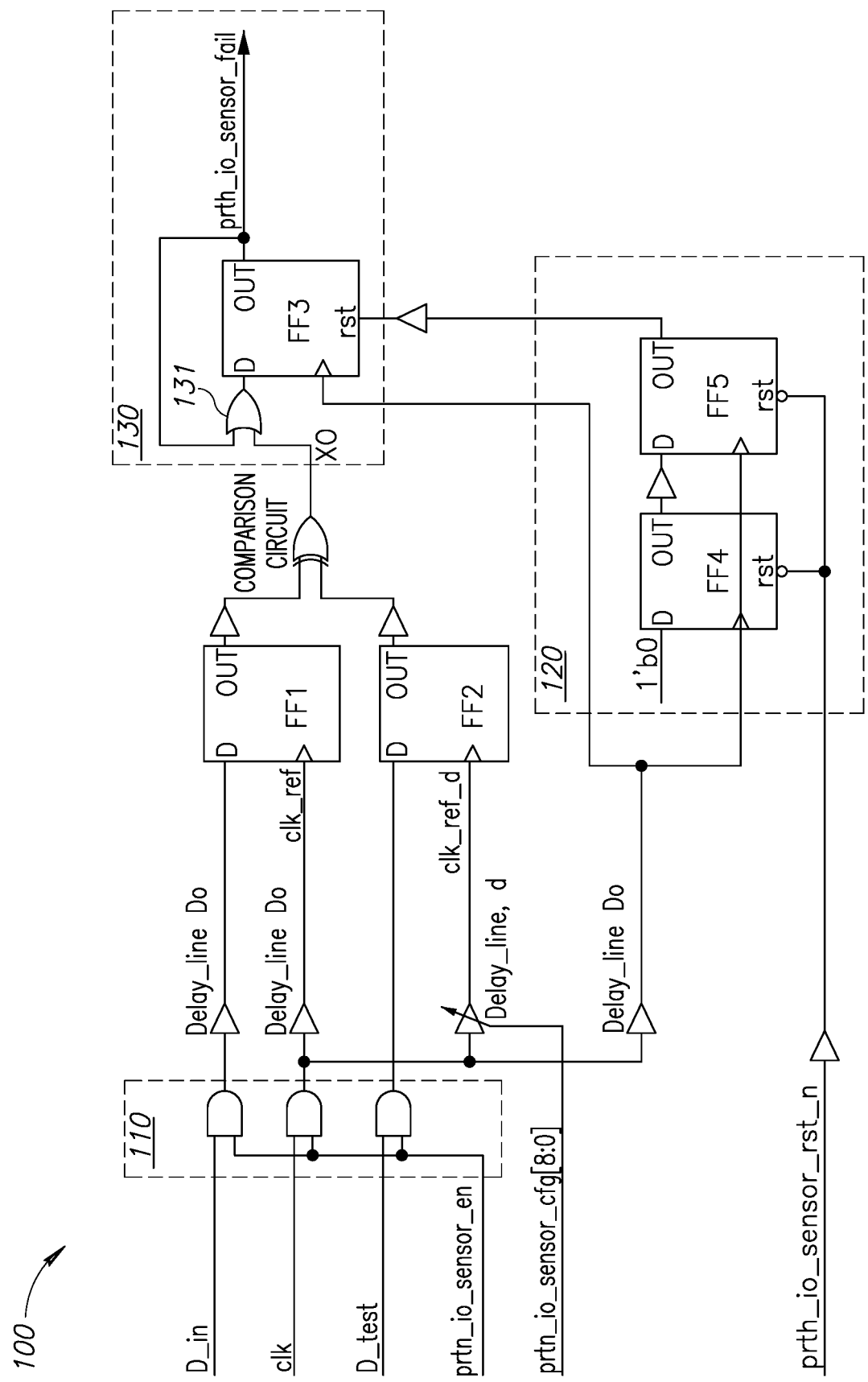
FIG. 2 shows a schematic circuit diagram of an example parametric loopback sensor or Loopback Tile Connectivity Agent (LBTCA) according to the disclosure.

Referring next to FIG. 2, there is shown a schematic circuit diagram of an example parametric loopback sensor or LBTCA 100 according to the disclosure (which may correspond with LBTCA 20 shown in FIG. 1). As discussed above, the LBTCA 100 is used to compare and thereby measure between a data input D_in and a data test port D_test. The LBTCA also receives a clock signal clk. The LBTCA comprises: a first flip-flop (sampling or state element) FF1; a second flip-flop (sampling or state element) FF2; fixed delay lines Do; adjustable or programmable delay line d; a comparison circuit, comprising any suitable comparison (logic) gate(s) and/or element(s), for example a XOR gate as shown in FIG. 2; enable circuitry 110 reset circuitry 120; and output circuitry 130. The fixed delay lines Do may be used to slightly delay the clock signal (clk) so as to compensate for the intrinsic delay of the delay-line d; even when the delay-line is at an initial state or position when it is not set to apply any delay, its very existence causes a delay of any signal traversing it (which should be equal to Do), to the tune of 3-12 picoseconds, typically (or beyond, in some implementations).

The enable circuitry 110 comprises a series of AND gates, each connected to one of the input signals at a first input and an enable signal (prtn_io_sensor_en) at a second input. In this way, the input signals are only used if the enable signal is a logic [1].

The data input Din and the clock signal clk are both delayed by respective fixed delay lines Do. The delayed data input signal is provided as a data input to the first flip-flop FF1 and the delayed clock signal (clk_ref) is provided as a clock input to the first flip-flop FF1.

The data test input D_test is provided as a data input to the second flip-flop FF2. The clock signal clk is also delayed by the adjustable or programmable delay line d and the so-delayed clock signal (clk_ref_d) is provided as a clock input to the second flip-flop FF2. The delay provided by the adjustable or programmable delay line d is controlled by an optionally 9-bit input configuration signal (prtn_io_sensor_cfg[8:0]).

In other words, the two data inputs (data input D_in and the data test input D_test) are sampled by the first flip-flop FF1 and the second flip-flop FF2. The first flip-flop FF1 samples the data from the data input D_in with a fixed clock (clk_ref) to provide a clocked data signal as an output and the second flip-flop FF2 samples data test input D_test with a shifted clock (clk_ref_d) to provide a clocked transmission output path signal as an output.

The outputs of the first flip-flop FF1 and the second flip-flop FF2 are provided (via respective buffers) as inputs to the comparison circuit. The comparison circuit is intended to compare the sampled data input and data test inputs and identify whether the comparison results in a pass or fail condition. Since the comparison circuit in this implementation comprises an XOR gate, the output of the comparison circuit (XO) is only a logic [1] if the output of the first flip-flop FF1 is different to the output of the second flip-flop FF2. It will be recognized that this can be implemented in alternative ways.

The output circuitry 130 comprises a third flip-flop (or state element) FF3. The third flip-flop FF3 captures the output of the comparison circuit XO until reset, by a signal to a reset input rst. This capturing is effected by an OR gate 131, which receives the output of the comparison circuit XO at one input and the output of the third flip-flop FF3 (which is effectively a sensor fail signal) at another input. The output of the OR gate 131 is provided as the data input to the third flip-flop FF3. The clock input to the third flip-flop FF3 is the fixed clock (clk_ref), that is the clock delayed by a fixed delay line Do. The third flip-flop FF3 is reset by the reset input rst each delay-line cycle (standard TCA operation), such that the output of the comparison circuit XO is captured for a full delay-line cycle. The sensor fail signal (the output of the third flip-flop FF3 ptrn_io_sensor_fail) can then be used for loopback performance measurement for the transmitter, as will be discussed further below.

The reset circuitry 120 comprises: a fourth flip-flop FF4; and a fifth flip-flop FF5. Both the fourth flip-flop FF4 and the fifth flip-flop FF5 receive the delayed version of the clock input clk as a clock input. The data input to the fourth flip-flop FF4 is a binary logic low level (1'b0). The data input to the fifth flip-flop FF5 is the output of the fourth flip-flop FF4 after passing through a buffer. A reset signal (prtn_io_sensor_rst_n) is received at the LBTCA 100 and a buffered version is applied to the fourth flip-flop FF4 and the fifth flip-flop FF5 at an inverted set input. The output of the fourth flip-flop FF4 after passing through a buffer is provided as the reset input of the third flip-flop FF3. This allows resetting of the LBTCA 100. Specifically, the fourth flip-flop FF4 and the fifth flip-flop FF5 are used to reset the third flip-flop FF3 and to de-assert the reset input after two rising edges of the clock. The shown reset circuitry is merely given as an example, and those of skill in the art will recognize other reset circuitry implementations that are configured to reset the third flip-flop FF3 and to de-assert the reset after one or more rising edges of the clock—as suitable for the implementation at hand.

Returning to the general senses of the disclosure, as discussed above, further additional optional and/or advantageous feature may be considered. For example, each parametric loopback sensor may comprise: a first state-element, configured to receive a signal derived from the clocked data input signal at a first state-element data input, to receive a signal derived from the clock signal at a first state-element clock input and to provide a clocked data signal as a first state-element output; a programmable delay line, configured to receive the clock signal and output a delayed clock signal; a second state-element, configured to receive the signal from the transmission output path at a second state-element data input, to receive the delayed clock signal at a second state-element clock input and to provide a clocked transmission output path signal as a second state-element output; and a comparison circuit, configured to generate a comparison circuit output based on a comparison of the clocked data signal and the clocked transmission output path signal. In embodiments, the comparison circuit comprises an XOR gate.

Optionally, each parametric loopback sensor further comprises: a third state-element, having a third state-element data input and configured to receive a signal derived from the clock signal at a clock input and to provide a sensor fail signal as an output; and an OR gate, configured to receive the comparison circuit output at a first input and the sensor fail signal at a second input, to generate an output based on the first and second inputs, the output of the OR gate being provided to the third state-element data input.

In embodiments, each parametric loopback sensor further comprises: a fourth state-element, configured to receive a low logic level at a fourth state-element data input and a signal derived from the clock signal at a fourth state-element clock input and to provide a fourth state-element output based on the received low logic level and a fourth state-element clock input, the fourth state-element further configured to receive a reset signal at a fourth state-element set state input; and a fifth state-element, configured to receive a signal based on the fourth state-element output at a fifth state-element data input and a signal derived from the clock signal at a fifth state-element clock input and to provide a fifth state-element output based on the signal received at the fifth state-element data input and the fifth state-element clock input, the fifth state-element further configured to receive the reset signal at a fifth state-element set state input. Then, the third state-element may be further configured to receive the fifth state-element output at a third state-element reset state input.

Additional reference to the general senses of the disclosure will be returned to below, after specific details of implementations are again discussed.

Figure 3:
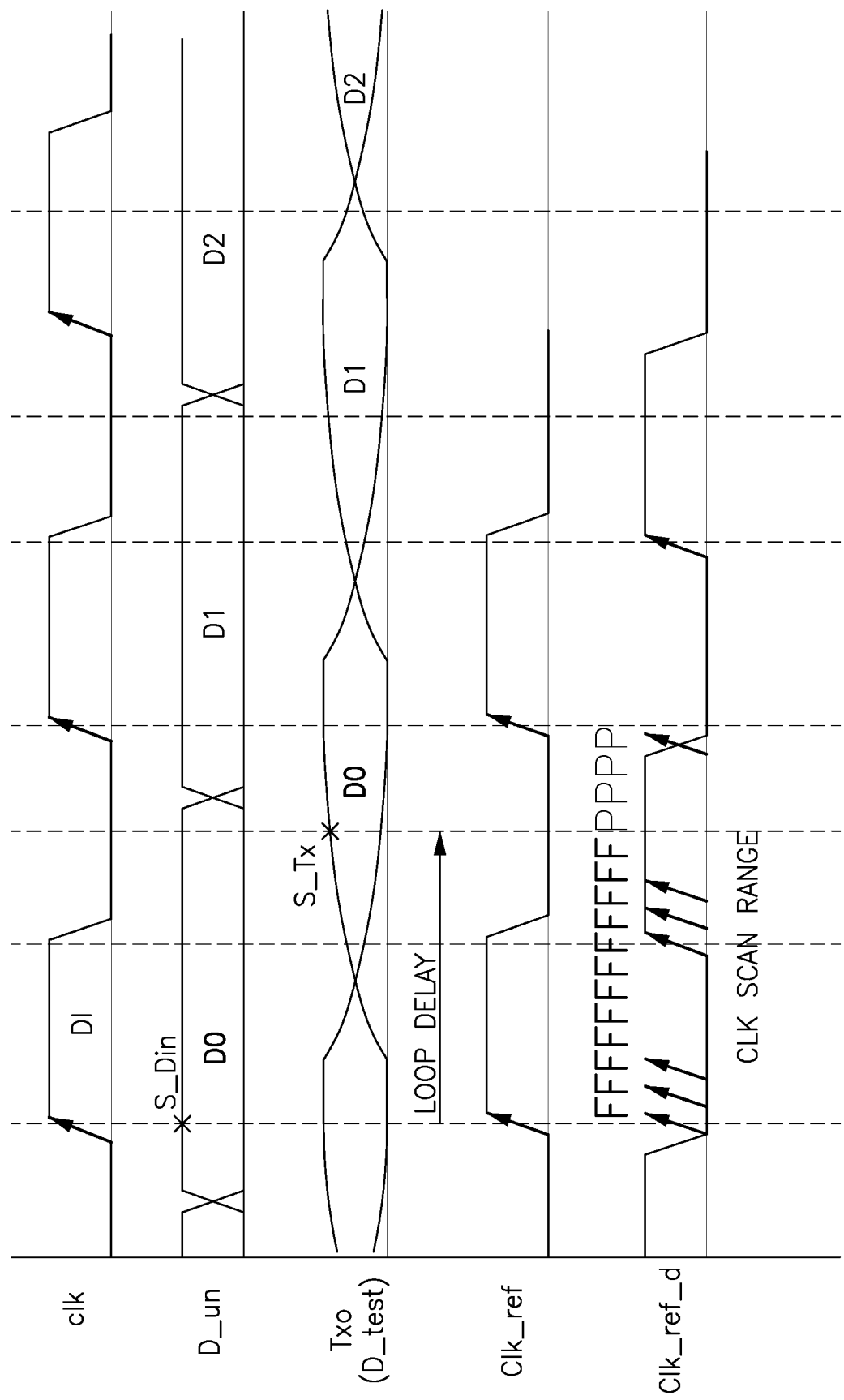
FIG. 3 shows example signal waveforms with respect to the parametric loopback sensor or LBTCA of FIG. 2.

Referring now to FIG. 3, there are shown example signal waveforms with respect to the LBTCA of FIG. 2. In the clock signal clk, the rising edges are marked with an arrow. In this example, the difference in delay (delta) between the fixed clock signal clk_ref and the delayed clock signal clk_ref_d is zero. This reflects the situation where the fixed clock signal clk_ref is delayed by the same time duration of the intrinsic delay of the delay line d. In other words, this represents the situation in which the delay of the fixed delay D0 is set accurately to correspond with the delay introduced by the intrinsic delay of the delay line d. Thus, the fixed clock signal Clk_ref is identical to the clock signal clk. The data input signal D_in changes to a first value D0 before a rising edge of the clock signal clk. At the rising edge of the clock signal clk, the data input signal Din is at a transmission value S_Din. The transmission path signal Txo (which is the same as the data test input signal D_test) changes to the first value D0 at a time after the rising edge of the clock signal clk; specifically, the time at which the transmission path signal Txo reaches the correct logic level for the first value D0 is marked S_Tx. The time between the rising edge of the clock signal clk and S_Tx is the loop delay.

In clock scan mode, this time is measured using the delayed clock signal (clk_ref_d). In FIG. 3, this signal is only shown for a single delay. In operation, however, the signal is generated for multiple different delays. This is shown in the drawing by repeated rising edges, each marked by a respective arrow. Above the arrows are shown the result of a comparison between the data input signal D_in and the transmission path signal Txo at the time of the delayed clock signal rising edge. A "P" indicates a pass result and a "F" indicates a fail result. For some cases, an arrow indicating the rising edge is not shown (so as to keep the figure clear), but the result of the comparison is shown.

Thus, as the delayed clock signal (clk_ref_d) is shifted, the LBTCA output will generate a Pass/Fail pattern. The length of the fail pattern (FFFF) corresponds to the loop delay. In other words, this represents the time between the rising/falling edge of the clock signal clk to rising/falling edge of the transmission path signal at the PAD (Txo). The loop delay may be a function of: (i) the time shift between the data input signal Din and the data test input signal D_test; (ii) pin load; (iii) transmission driver strength; (iv) transmission driver connectivity to the PAD0. A longer fail pattern length may indicate a long loop delay. The loop delay can be converted to picoseconds [ps] by multiplying the number of fails by the delay-line delay step length (in ps).

In fixed clock mode, the clock is not shifted and stays at a constant position within the Pass range. The LBTCA fail indication then indicates a loop-back fail.

Figure 4:
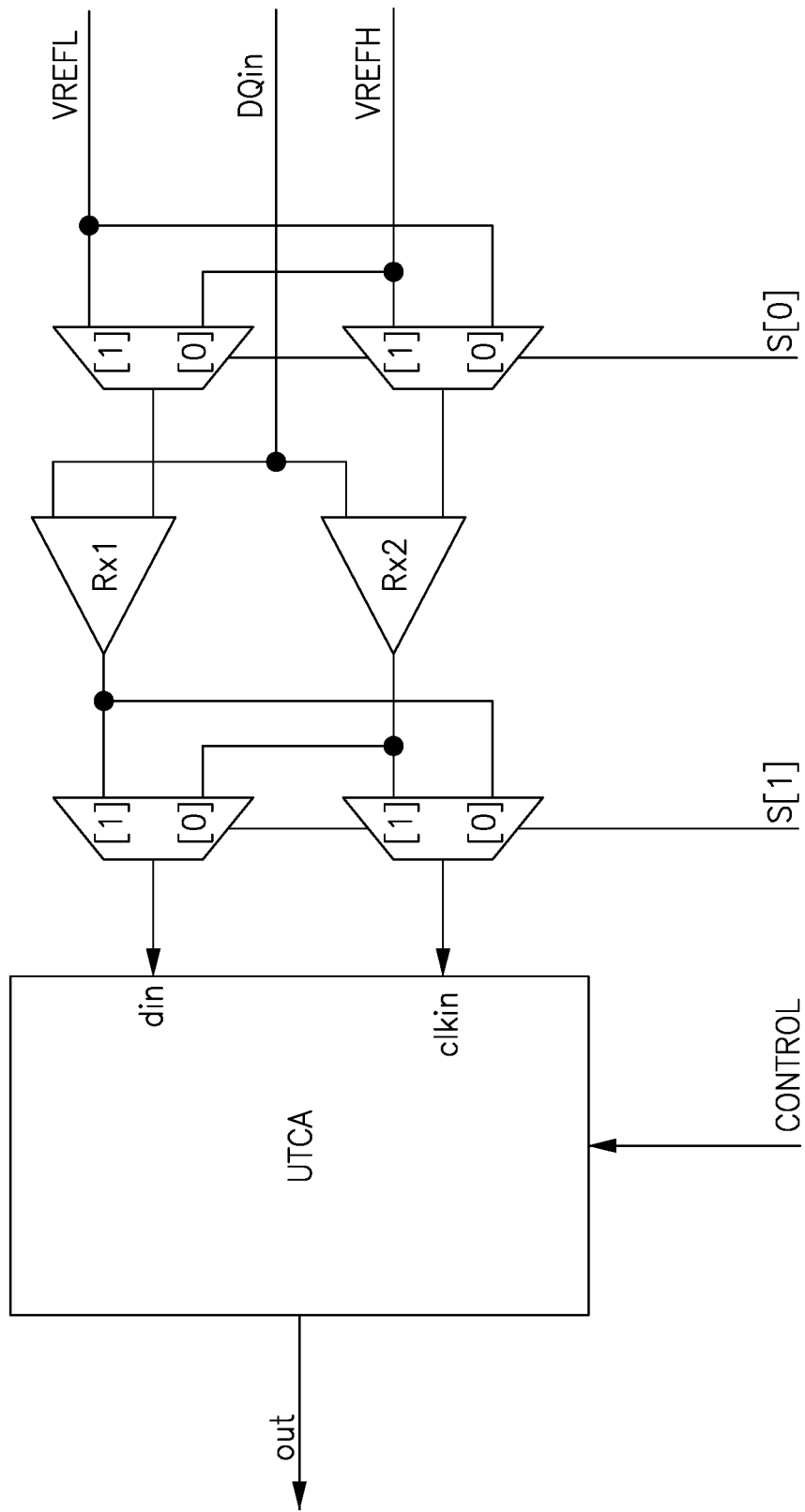
FIG. 4 shows a schematic block diagram of a SRTCA for use with the disclosure.

With reference to FIG. 4, there is shown a schematic block diagram of a SRTCA, such as the pin characterization sensor 36 of FIG. 1, for use with the disclosure. The SRTCA receives as inputs: a signal input (DQin); a low reference voltage level (VREFL); and a high reference voltage level (VREFH). As noted above, the pin characterization sensor 36 shown in FIG. 1 is represented in a simplistic way, with only input shown to the pin characterization sensor 36 corresponding with the signal input (DQin) of the SRTCA of FIG. 4. Typically, VREFL is less than VREFH. The SRTCA provides an output (out) and further receives a control signal. A slew rate is calculated as: measured time duration/ (VREFH−VREFL) [ps/V].

The SRTCA is based on a delay time measurement sensor, which is termed a Unified Tile Connectivity Agent (UTCA). The UTCA sensor has two key inputs: a data signal input (din), which would normally come from the pin or lane being measured; and a clock input (clkin). Effectively, the output of the UTCA indicates a measurement of the timing distance between an edge of the signal at the UTCA clock input (clkin) input and the signal at the data signal input (din).

Hence, the SRTCA may be formed from a UTCA by the addition of the further circuitry shown. Specifically, there is provided: a first receive (Rx1) comparator circuit, configured to generate a signal based on a comparison of the received signal input (Dqin) with a first provided level, in this case the low reference level (VREFL); and a second receive (Rx2) comparator circuit, configured to generate a signal based on a comparison of the received signal input (Dqin) with a second provided level, in this case the high reference level (VREFH). The output of the first Rx comparator circuit Rx1 is provided as the data signal input of the UTCA and the output of the second Rx comparator circuit Rx2 is provided as the clock input of the UTCA. Advantageously, each Rx comparator circuit is configured to generate a signal having an edge when the received signal input is at the respective provided reference level. It should be noted that, in this configuration, the SRTCA may operate with a different clock from the remainder of the IC, so additional synchronization may be used.

A typical loopback measurement is only concerned with the transmission path. However, it is possible to consider an enhanced loopback measurement, which considers the effect of the transmission path on the received signal. This may be investigated by incorporating a receiver into a loopback measurement, as will now be discussed.

Figure 5:
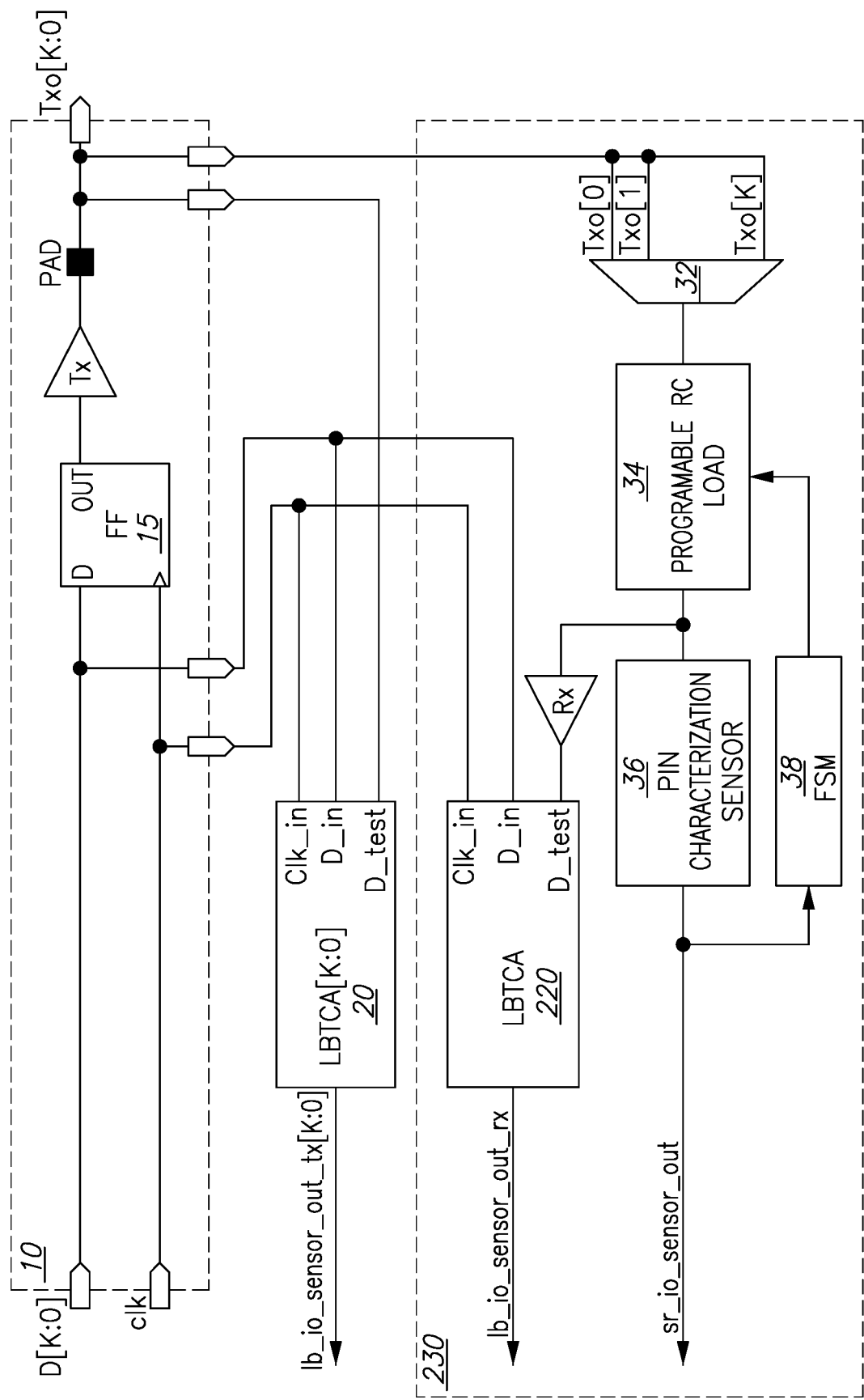
FIG. 5 shows a schematic circuit diagram of an example loopback testing system according to another embodiment of the disclosure.

With reference to FIG. 5, there is shown a schematic circuit diagram of an example loopback testing system according to another embodiment of the disclosure. This is similar to the implementation shown in FIG. 1 and where the same features are included, identical reference signs have been used.

As in FIG. 1, each transmission path (I/O circuit) 10 comprises a flip-flop (sampling or state element) 15, receiving a data signal D[K:0] at a data signal input D and a clock signal clk at a clock signal input. The output out of the flip-flop 15 is provided to a transmitter (or transmission buffer) Tx. The output of the transmitter is provided a transmission signal Txo to drive the transmission pin, via the contact pad (PAD).

In this implementation, the loopback testing system comprises: a first parametric loopback sensor 20; and a load circuit 230. The parametric loopback sensor or Tile Connectivity Agent (TCA) 20 (LBTCA[K:0]) is as discussed with reference to FIGS. 1 and 2 above. Each transmission path 10 has a respective, separate parametric loopback sensor 20.

The load circuit 230 is beneficially programmable and is common to all K transmission paths. Similarly to the load circuit discussed with reference to FIG. 1, the load circuit 230 comprises: a multiplexer 32; a programmable RC load (RC filter) 34, which may represent a realistic pin load, as discussed above; a pin characterization sensor 36 (for example, a slew rate sensor or TCA); and FSM 38. In addition, the load circuit 230 also comprises a receiver block Rx (which may be more generally termed a receiver) and a second parametric loopback sensor or LBTCA 220. The receiver block Rx receives the output of the programmable RC load 34 and generates a receive signal as a receiver output accordingly.

The second LBTCA 220 may have the same design or structure as the first LBTCA 20 (for example, as shown with reference to FIG. 2, discussed above). Like the first LBTCA 20, the second LBTCA 220 receives the data signal input D at a data input port D_in and the clock signal clk at a clock input port Clk_in. However, the receive signal that is output by the receiver block Rx is provided at a test signal input port D_test of the second LBTCA 220. It provides a second loopback measurement output lb_io_sensor_out_rx. This measurement is indicative of the loopback delay for the transmission and reception paths. It may therefore allow comparison between different transmission pins considering a full receiver stage. Other issues can be diagnosed using this approach, especially those resulting in degradation of received signal. The second LBTCA 220 may therefore be common to multiple (or all) transmission output paths in implementations.

Returning again to the general senses of the disclosure, further additional optional and/or advantageous feature may be considered. For instance, each of the one or more parametric loopback sensors may be a respective first parametric loopback sensor. Then, the loopback testing system may further comprise: one or more receivers, each receiver being configured to receive a signal from the programmable load circuit coupled to a respective one of the one or more transmission output paths and to generate a respective receiver output; and one or more second parametric loopback sensors, each second parametric loopback sensor being configured to receive a respective receiver output from a receiver of the one or more receivers and a signal from a transmission output path from the respective transmitter of the IC and to generate a respective second sensor output based on a comparison of the receiver output and the signal from the transmission output path for the respective transmitter of the IC.

In embodiments, a structure of the one or more second parametric loopback sensors is the same as structure of the one or more first parametric loopback sensors.

In embodiments, the programmable load circuit comprises a programmable load, configured to receive the signal from a transmission output path and provide a loaded signal output and wherein each receiver is configured to receive the loaded signal output as the signal from the programmable load circuit.

In embodiments, the one or more receivers comprise a common receiver for all of the one or more transmission output paths and the one or more second parametric loopback sensors comprise a common second parametric loopback sensor for all of the one or more transmission output paths.

Figure 6:
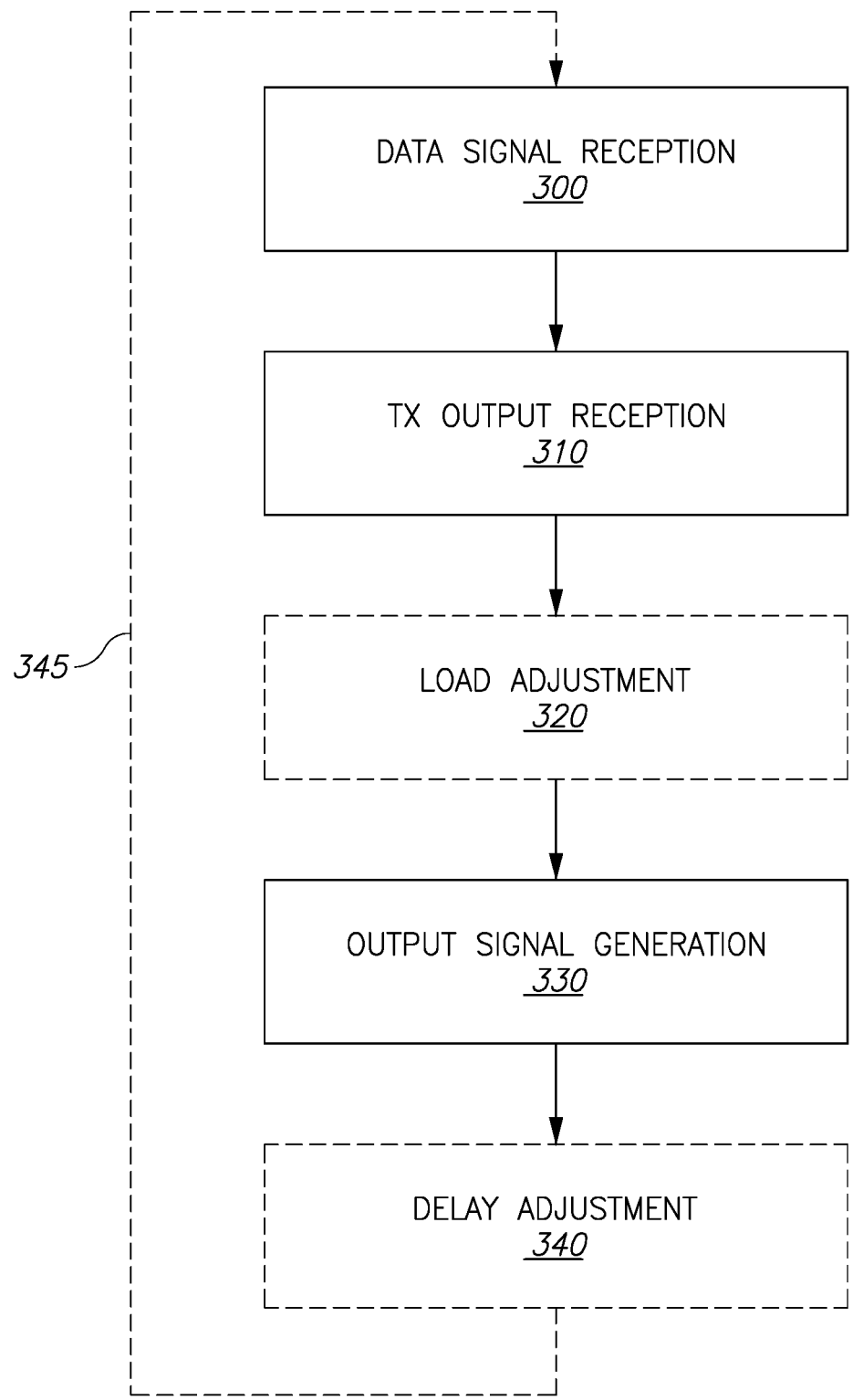
FIG. 6 shows a flowchart for an example mode of operation of a loopback testing system according to the disclosure.

With reference to FIG. 6, there is shown a flowchart for an example mode of operation of a loopback testing system according to the disclosure. In a data signal reception step 300, a parametric loopback sensor of the loopback testing system receives a clocked data input signal to an associated transmitter of the IC and a signal from a transmission output path from the transmitter. Beneficially, the parametric loopback sensor also receives a clock signal associated with the clocked data input signal (for instance, the clock signal is also used for a state element forming part of the transmission output path).

In a Tx output reception step 310, the loopback testing system receives a signal from the transmission output path at a programmable load circuit of the loopback testing system. The programmable load applies a load (typically a RC load) to the transmission output path accordingly. In a load adjustment (optional) step 330, a programmable load of the programmable load circuit is adjusted based on the to generate a respective sensor output based on the signal received from the transmission output path. For example, this may be implemented using a feedback loop, comprising a pin characterization sensor (for example, a slew-rate characterization sensor) that generates a characterization signal based on the output of the programmable load and a finite state machine (feedback circuit or internal logic) that sets (or adjusts) the programmable load based on the characterization signal.

In an output signal generation step 330, the parametric loopback sensor generates an output signal based on a comparison of the clocked data input signal and the signal from the transmission output path. This output signal generation step 330 may be implemented for a certain delay value (which may be set or adjusted by a controller). In a delay adjustment (optional) step 340, which may be applied when the parametric loopback sensor is operated in a clock-scan mode, the delay value is set or adjusted. Then, the process returns to the first step 300, as shown by dashed line 345. Other steps can be understood from the description of the loopback testing system as described herein.

The semiconductor IC may be part of a 'multi-IC module'. This may describe a group of interconnected ICs that are integrated and packaged together, and are configured to cooperate through this interconnection in order to achieve a certain joint functionality. The ICs in the module may communicate with each other through an interconnect bus (sometimes also called simply an "interconnect," a "lane," or "a channel"), for example. Their physical integration may be horizontal, vertical, or both.

A multi-IC module may be constructed by any known or later introduced integration technology, which either provides for direct connection between ICs, or indirect connection through an intermediary such as a certain interposer, substrate, circuit board, and/or the like. It is also possible for a multi-IC module to employ both direct and indirect connectivity between various pairs of its integrated ICs. Examples of today's multi-IC module integration technologies include Chip on Wafer on Substrate (CoWoS), Wafer On Wafer (WoW), Chip On Wafer (CoW), and 3D IC. However, embodiments of the invention are certainly beneficial also for any other type of multi-IC module which feature die-to-die (IC-to-IC) connectivity or chip-to-chip (C2C) connectivity.

C2C connectivity may be different from die-to-die connectivity. In C2C interconnects, the capacitance may be significantly higher than in other multi-IC module integration technologies due to higher lane length. To reduce any speed limitations on the interconnect, encoding of the data transmitted over the interconnect channel may be implemented (error control or channel coding). Specific encoding patterns may thus be used in calibration of the interconnect. The same or similar patterns may be employed for I/O monitoring. The I/O monitoring may be enabled during the lane training phase at a pre-defined data-rate.

Interconnects between dies and/or chips may implement wide buses and/or low power (picojoules/bit). Quality issues can be the cause of open-circuit, short-circuit, bridge-short (signal to signal), micro-bump resistance degradation at the receiver side, and/or micro-bump resistance degradation at the transmitter side. In this case, the timing of the signal at the receiver is expected to change and the change can be detected by a monitoring system. Timing effects and power effects of this monitoring are minimal.

A range of circuit designs and schematics are described herein. It will be appreciated that these circuit designs can be embodied in an electronic (also 'digital') representation (also 'encoding'). The electronic representation may be stored in a computer readable medium, particularly of a non-transitory nature. A suitable electronic representation may include a representation for Electronic Computer-Aided Design (ECAD) software, also referred to as Electronic Design Automation (EDA) software. In this case, parts of the representation may be stored across multiple electronic documents or files, possibly including one or more libraries of the ECAD software providing details of the components of the circuit. The ECAD representation may provide instructions suitable for manufacture (also 'fabrication') of a circuit as represented in the design. According to the disclosure, there may be provided such an electronic representation. A method of using such an electronic representation of an electronic circuit as part of manufacturing the electronic circuit is further considered.

Throughout this disclosure, various embodiments may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

In the description and claims of the disclosure, each of the words "comprise" "include" and "have", and forms thereof, are not necessarily limited to members in a list with which the words may be associated. In addition, where there are inconsistencies between this application and any document incorporated by reference, it is hereby intended that the present application controls.

To clarify the references in this disclosure, it is noted that the use of nouns as common nouns, proper nouns, named nouns, and the/or like is not intended to imply that embodiments of the invention are limited to a single embodiment, and many configurations of the disclosed components can be used to describe some embodiments of the invention, while other configurations may be derived from these embodiments in different configurations.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Conventional and/or contemporary circuit design and layout tools may be used to implement the invention. The specific embodiments described herein, and in particular the various circuit arrangements, measurements and data flows, are illustrative of exemplary embodiments, and should not be viewed as limiting the invention to such specific implementation choices. Accordingly, plural instances may be provided for components described herein as a single instance. The determination of a timing parameter, margin and/or other parameters may be made in different parts of the configuration, for example.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings (which may be termed programs) and representations of same, whether embodied in media or combined with suitable reader facilities to allow fabrication, test, or design refinement of the corresponding circuits and/or structures. Structures and functionality presented as discrete components in the exemplary configurations may be implemented as a combined structure or component. The invention is contemplated to include circuits, systems of circuits, related methods, and computer-readable (medium) encodings of such circuits, systems, and methods, all as described herein, and as defined in the appended claims. As used herein, a computer readable medium includes at least disk, tape, or other magnetic, optical, or semiconductor (e.g., flash memory cards, ROM) medium that is non-transitory.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. In particular, even though the main embodiments are described in the context of a specific type of parametric loopback sensor, the teachings of the present disclosure are believed advantageous for use with other types of parametric loopback sensor that may use different circuitry. Moreover, the techniques described herein may also be applied to other types of circuit applications. Accordingly, other variations, modifications, additions, and improvements may fall within the scope of the invention as defined in the claims that follow.

Embodiments of the present invention may be used to fabricate, produce, and/or assemble integrated circuits and/or products based on integrated circuits.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. A loopback testing system for one or more transmission output paths of a semiconductor Integrated Circuit (IC), the system comprising:
   one or more parametric loopback sensors in the semiconductor IC,
   wherein each parametric loopback sensor is configured to receive a clocked data input signal to a respective transmitter of the IC and a signal from a transmission output path from the respective transmitter of the IC,
   wherein each parametric loopback sensor is further configured to generate a respective sensor output based on a comparison of the clocked data input signal and the signal from the transmission output path for the respective transmitter of the IC; and
   the system further comprising:
   a programmable load circuit in the semiconductor IC, coupled to each transmission output path so as to apply a load to the respective transmission output path thereby.

2. The loopback testing system of claim 1, wherein the one or more transmission output paths are a plurality of transmission output paths and the one or more parametric loopback sensors are a plurality of parametric loopback sensors, the programmable load circuit comprising:
   a programmable load; and
   a multiplexer, coupled to each transmission output path of the plurality transmission output paths and configured to selectively couple one of the received transmission output paths to the programmable load.

3. The loopback testing system of claim 2, wherein the programmable load is an RC load.

4. The loopback testing system of claim 1, wherein the programmable load circuit comprises:
- a programmable load, configured to receive the signal from a transmission output path and provide a loaded signal output;
- a pin characterization sensor, configured to receive the loaded signal output and generate a characterization signal based on the loaded signal output; and
- a finite state machine, configured to set the programmable load based on the characterization signal.

5. The loopback testing system of claim 4, wherein the pin characterization sensor comprises a slew rate characterization sensor.

6. The loopback testing system of claim 1, wherein each of the one or more parametric loopback sensors is a respective first parametric loopback sensor, the loopback testing system further comprising:
- one or more receivers, each receiver being configured to receive a signal from the programmable load circuit coupled to a respective one of the one or more transmission output paths and to generate a respective receiver output; and
- one or more second parametric loopback sensors, each second parametric loopback sensor being configured to receive a respective receiver output from a receiver of the one or more receivers and a signal from a transmission output path from the respective transmitter of the IC and to generate a respective second sensor output based on a comparison of the receiver output and the signal from the transmission output path for the respective transmitter of the IC.

7. The loopback testing system of claim 6, wherein a structure of the one or more second parametric loopback sensors is the same as structure of the one or more first parametric loopback sensors.

8. The loopback testing system of claim 6, wherein the programmable load circuit comprises a programmable load, configured to receive the signal from a transmission output path and provide a loaded signal output and wherein each receiver is configured to receive the loaded signal output as the signal from the programmable load circuit.

9. The loopback testing system of claim 6, wherein the one or more receivers comprise a common receiver for all of the one or more transmission output paths and the one or more second parametric loopback sensors comprise a common second parametric loopback sensor for all of the one or more transmission output paths.

10. The loopback testing system of claim 1, wherein each transmitter of the IC has an associated input state element receiving a respective clock signal and wherein each of the one or more parametric loopback sensors is further configured to receive the respective clock signal.

11. The loopback testing system of claim 10, wherein each parametric loopback sensor is configured to selectively operate: in a clock-scan mode, in which the parametric loopback sensor is repeatedly operated to generate the respective sensor output using a different delay applied to the received clock signal; and in a fixed-clock mode, in which the parametric loopback sensor is repeatedly operated to generate the respective sensor output using the same delay applied to the received clock signal.

12. The loopback testing system of claim 1, wherein each parametric loopback sensor comprises:
- a first state-element, configured to receive a signal derived from the clocked data input signal at a first state-element data input, to receive a signal derived from the clock signal at a first state-element clock input and to provide a clocked data signal as a first state-element output;
- a programmable delay line, configured to receive the clock signal and output a delayed clock signal;
- a second state-element, configured to receive the signal from the transmission output path at a second state-element data input, to receive the delayed clock signal at a second state-element clock input and to provide a clocked transmission output path signal as a second state-element output; and
- a comparison circuit, configured to generate a comparison circuit output based on a comparison of the clocked data signal and the clocked transmission output path signal.

13. The loopback testing system of claim 12, wherein each parametric loopback sensor further comprises:
- a third state-element, having a third state-element data input and configured to receive a signal derived from the clock signal at a clock input and to provide a sensor fail signal as an output; and
- an OR gate, configured to receive the comparison circuit output at a first input and the sensor fail signal at a second input, to generate an output based on the first and second inputs, the output of the OR gate being provided to the third state-element data input.

14. The loopback testing system of claim 13, wherein each parametric loopback sensor further comprises:
- a fourth state-element, configured to receive a low logic level at a fourth state-element data input and a signal derived from the clock signal at a fourth state-element clock input and to provide a fourth state-element element output based on the received low logic level and a fourth state-element clock input, the fourth state-element further configured to receive a reset signal at a fourth state-element set state input; and
- a fifth state-element, configured to receive a signal based on the fourth state-element output at a fifth state-element data input and a signal derived from the clock signal at a fifth state-element clock input and to provide a fifth state-element output based on the signal received at the fifth state-element data input and the fifth state-element clock input, the fifth state-element further configured to receive the reset signal at a fifth state-element set state input; and
- wherein the third state-element is further configured to receive the fifth state-element output at a third state-element reset state input.

15. An input/output (I/O) block for a semiconductor Integrated Circuit (IC), the I/O block comprising:
- a plurality of transmitters, each transmitter being configured to receive a respective clocked data input signal and output a transmission signal on a respective transmission output path;
- a plurality of parametric loopback sensors, each parametric loopback sensor being configured to receive the clocked data input signal and transmission signal for a respective transmitter, and to generate a respective sensor output based on a comparison of the clocked data input signal and the transmission signal for the respective transmitter; and
- a programmable load circuit, coupled to each transmission output path so as to apply a load to the respective transmission output path thereby.

16. The I/O block of claim 15, wherein the programmable load circuit comprises:
- a programmable load; and
- a multiplexer, configured to receive the respective transmission signal from each transmission output path and selectively couple one of the received transmission signals to the programmable load.

17. The I/O block of claim 15, wherein the programmable load circuit comprises:
- a programmable load, configured to receive the transmission signal from a transmission output path and provide a loaded signal output;
- a pin characterization sensor, configured to receive the loaded signal output and generate a characterization signal based on the loaded signal output; and
- a finite state machine, configured to set the programmable load based on the characterization signal.

18. The I/O block of claim 15, wherein each transmitter has a respective contact pad in the transmission output path or wherein each transmitter corresponds with a respective pin of the semiconductor IC.

19. A semiconductor Integrated Circuit (IC), comprising:
- a plurality of pins, each pin defining a respective transmission output path, a signal carried on each transmission output path being based on a respective IC internal clocked data signal;
- a plurality of parametric loopback sensors, each parametric loopback sensor being configured to receive the IC internal clocked data signal and the signal carried on the transmission output for a respective pin, and to generate a respective sensor output based on a comparison of the IC internal clocked data signal and the signal carried on the transmission output for the respective pin; and
- a programmable load circuit, coupled to each transmission output path so as to apply a load to the respective transmission output path thereby.

20. A non-transitory computer readable medium having stored thereon a computer-readable encoding of a loopback testing system, the computer-readable encoding of the loopback testing system comprising encodings of:
- one or more parametric loopback sensors, each parametric loopback sensor being configured to receive a clocked data input signal to a respective transmitter of the IC and a signal from a transmission output path from the respective transmitter of the IC and to generate a respective sensor output based on a comparison of the clocked data input signal and the signal from the transmission output path for the respective transmitter of the IC; and
- a programmable load circuit, coupled to each transmission output path so as to apply a load to the respective transmission output path thereby.

* * * * *